United States Patent
Aketa et al.

(10) Patent No.: US 9,478,673 B2
(45) Date of Patent: Oct. 25, 2016

(54) SEMICONDUCTOR DEVICE WITH TRENCH STRUCTURE AND MANUFACTURING METHOD THEREOF

(71) Applicant: ROHM CO., LTD., Kyoto-shi, Kyoto (JP)

(72) Inventors: Masatoshi Aketa, Kyoto (JP); Yuta Yokotsuji, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/650,819

(22) PCT Filed: Dec. 2, 2013

(86) PCT No.: PCT/JP2013/082371
§ 371 (c)(1),
(2) Date: Jun. 9, 2015

(87) PCT Pub. No.: WO2014/091961
PCT Pub. Date: Jun. 19, 2014

(65) Prior Publication Data
US 2015/0333190 A1    Nov. 19, 2015

(30) Foreign Application Priority Data

Dec. 10, 2012 (JP) .................... 2012-269771

(51) Int. Cl.
*H01L 29/872* (2006.01)
*H01L 29/66* (2006.01)
(Continued)

(52) U.S. Cl.
CPC ....... *H01L 29/872* (2013.01); *H01L 21/02236* (2013.01); *H01L 21/0495* (2013.01); *H01L 21/28556* (2013.01); *H01L 29/045* (2013.01);
(Continued)

(58) Field of Classification Search
CPC .......... H01L 29/872; H01L 21/28556; H01L 29/66143; H01L 29/408; H01L 21/02236; H01L 21/0495; H01L 29/0661; H01L 29/1608
See application file for complete search history.

(56) References Cited

U.S. PATENT DOCUMENTS 7,915,672 B2 * 3/2011 Venkatraman ........ H01L 29/407
257/330
8,436,366 B2 * 5/2013 Harada ................. H01L 29/808
257/627
(Continued)

FOREIGN PATENT DOCUMENTS

JP   2005-79339    3/2005
JP   2007-258465   10/2007
(Continued)

OTHER PUBLICATIONS

International Search Report, Feb. 18, 2014; PCT/JP2013/082371.

*Primary Examiner* — William Coleman
(74) *Attorney, Agent, or Firm* — Hamre, Schumann, Mueller & Larson, P.C.

(57) ABSTRACT

The semiconductor device of the present invention includes a semiconductor layer made of a wide bandgap semiconductor, a trench that is selectively formed on a surface portion of the semiconductor layer and that defines a unit cell having a predetermined shape on the surface portion, and a surface electrode that is embedded in the trench so as to cover an upper surface of the unit cell and that forms a Schottky junction between the unit cell and the surface electrode, and side surfaces of the trench are formed of only a plurality of planes that have plane orientations crystallographically equivalent to each other.

27 Claims, 24 Drawing Sheets

(51) Int. Cl.
  *H01L 29/40* (2006.01)
  *H01L 21/02* (2006.01)
  *H01L 21/04* (2006.01)
  *H01L 21/285* (2006.01)
  *H01L 29/04* (2006.01)
  *H01L 29/06* (2006.01)
  *H01L 29/16* (2006.01)
  *H01L 29/20* (2006.01)

(52) U.S. Cl.
  CPC ....... *H01L 29/0619* (2013.01); *H01L 29/0661* (2013.01); *H01L 29/0692* (2013.01); *H01L 29/1608* (2013.01); *H01L 29/402* (2013.01); *H01L 29/408* (2013.01); *H01L 29/6606* (2013.01); *H01L 29/66143* (2013.01); *H01L 21/02255* (2013.01); *H01L 29/1602* (2013.01); *H01L 29/2003* (2013.01)

(56) References Cited

U.S. PATENT DOCUMENTS

| | | | |
|---|---|---|---|
| 8,987,812 B2 * | 3/2015 | Kono | H01L 21/0465 257/328 |
| 2005/0077591 A1 | 4/2005 | Fukuda et al. | |
| 2006/0086939 A1 | 4/2006 | Carta et al. | |
| 2009/0289262 A1 | 11/2009 | Zhang et al. | |
| 2012/0138951 A1 | 6/2012 | Hayashi et al. | |
| 2012/0313212 A1 | 12/2012 | Sugawara | |

FOREIGN PATENT DOCUMENTS

| | | |
|---|---|---|
| JP | 2008-518445 | 5/2008 |
| JP | 2010-192555 | 9/2010 |
| JP | 2011-521471 | 7/2011 |
| JP | 2011-238831 | 11/2011 |
| WO | 2011/105434 | 9/2011 |
| WO | 2011/145309 | 11/2011 |

* cited by examiner

FIG. 4
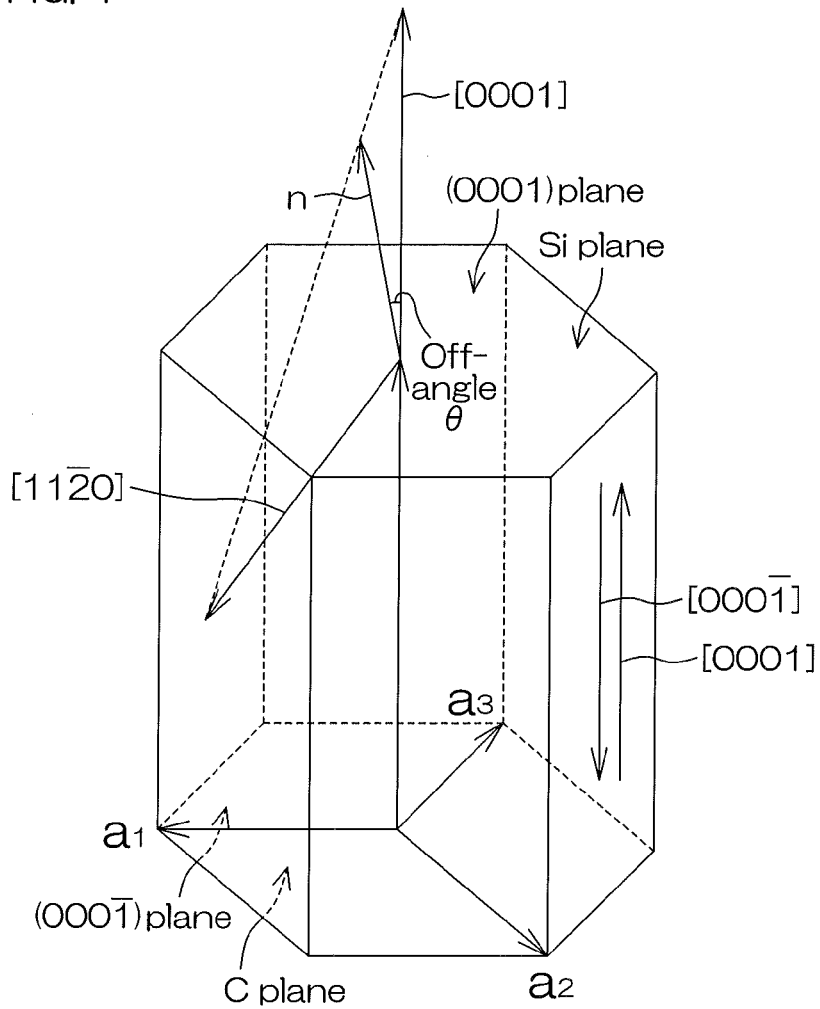
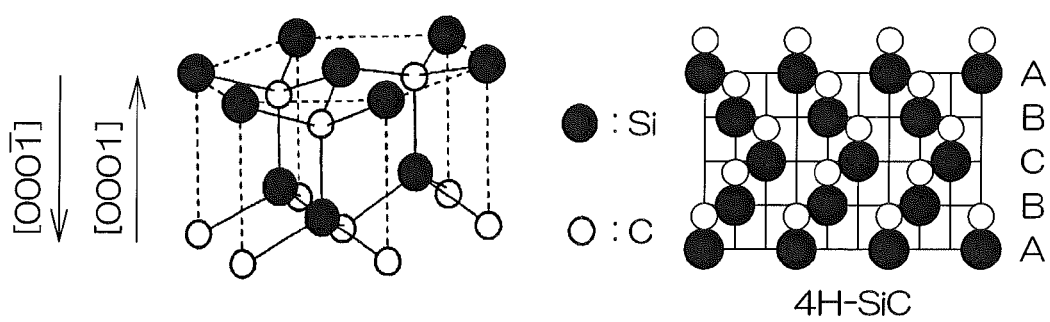
4H-SiC

US 9,478,673 B2

SEMICONDUCTOR DEVICE WITH TRENCH STRUCTURE AND MANUFACTURING METHOD THEREOF

TECHNICAL FIELD

The present invention relates to a semiconductor device that includes a Schottky barrier diode and relates to a method for manufacturing the semiconductor device.

BACKGROUND ART

Attention has heretofore been paid to a semiconductor power device that is used chiefly in systems, such as a motor control system and a power conversion system, in various power electronics fields. A SiC Schottky barrier diode is publicly known as the semiconductor power device (see Patent Document 1, for example).

CITATION LIST

Patent Documents

Patent Document 1: Japanese Patent Application Publication No. 2005-79339

SUMMARY OF INVENTION

Solution to Problem

The semiconductor device of the present invention includes a semiconductor layer made of a wide bandgap semiconductor, a trench that is selectively formed on a surface portion of the semiconductor layer and that defines a unit cell having a predetermined shape on the surface portion, and a surface electrode that is embedded in the trench so as to cover an upper surface of the unit cell and that forms a Schottky junction between the unit cell and the surface electrode, and side surfaces of the trench are formed of only a plurality of planes that have plane orientations crystallographically equivalent to each other.

The semiconductor device of the present invention can be manufactured by a semiconductor-device manufacturing method of the present invention that includes, for example, a step of forming a trench by etching a semiconductor layer made of a wide bandgap semiconductor so that side surfaces are formed of only a plurality of planes that have plane orientations crystallographically equivalent to each other, and, simultaneously, defining a unit cell having a predetermined shape by means of the trench, a step of forming a sacrificial oxide film on the side surfaces of the trench by means of thermal oxidation, a step of peeling off the sacrificial oxide film, and a step of embedding a surface electrode in the trench so as to cover the upper surface of the unit cell after peeling off the sacrificial oxide film, the surface electrode being made of a material that forms a Schottky junction between the unit cell and the surface electrode.

According to this method, the plane orientations of the side surfaces (side surfaces of the unit cell) of the trench are crystallographically equivalent to each other, and therefore it is possible to make the side surfaces of the trench uniform so as to have the same anisotropic structure. Therefore, it is possible to make the degree of the damages suffered by the side surfaces of the trench uniform during etching. Additionally, it is possible to form a sacrificial oxide film with uniform film quality at a constant oxidation rate with respect to the side surfaces of the trench. As a result, it is possible to improve the damages of the side surfaces of the trench at the same level by means of the sacrificial oxide film.

Therefore, in the semiconductor device manufactured by this method, it is possible to make physical properties of the side surfaces of the trench even. Therefore, even if a reverse leakage current flows through the side surfaces (side surfaces of the unit cell) of the trench, it is possible to reduce variations in this reverse leakage current.

Additionally, the unit cell is defined by the trench, and therefore it is possible to lessen electric field concentration at the upper surface of the unit cell. This makes it possible to weaken the electric field strength in the upper surface of the unit cell, and hence makes it possible to reduce the reverse leakage current through the upper surface of the unit cell. Additionally, it is possible to lower a barrier height between the unit cell and the surface electrode being in contact with the upper surface of the unit cell, and therefore it is possible to reduce a forward voltage.

Preferably, the side surfaces of the trench are formed of only a plurality of planes that move to each other as a result of a symmetry operation in which a rotation of a predetermined angle is made around a predetermined crystallographic axis. More specifically, preferably, when the semiconductor layer is made of 4H—SiC, the side surfaces of the trench are formed of only a plurality of planes that move to each other as a symmetry operation in which a rotation of 60 degrees is made around a [0001] axis.

Preferably, the unit cell is formed in a linear shape, or a rhombic shape, or a hexagonal shape when viewed planarly.

Preferably, the semiconductor layer includes a first conductivity type electric field relaxation layer formed so as to follow a part of or all of inner surfaces of the trench and a second conductivity type drift layer formed contiguously with the electric field relaxation layer so as to be exposed to the upper surface of the unit cell, and the surface electrode forms a Schottky junction between the drift layer and the surface electrode.

This arrangement makes it possible to reduce a reverse leakage current through the inner surfaces (bottom surface and side surface) of the trench.

Preferably, the electric field relaxation layer includes a highly-concentrated layer that is selectively formed at a part exposed from the inner surfaces of the trench and that is higher in concentration than other parts of the electric field relaxation layer.

This arrangement makes it possible to form an ohmic contact between the surface electrode and the highly-concentrated layer.

The highly-concentrated layer may be formed in an area that is shallower than a depth position of 1000 Å from the inner surfaces of the trench.

Preferably, the surface of the semiconductor layer is partitioned into an active region in which the unit cell is disposed and an outer peripheral region that surrounds the active region, and the semiconductor device further includes a removal region formed at the surface portion of the semiconductor layer in the outer peripheral region and a first conductivity type terminal structure formed so as to follow a bottom surface of the removal region.

This arrangement makes it possible to prevent equipotential surfaces from densely gathering between the trench and the removal region by means of a depletion layer generated from a pn junction portion of an interface between the terminal structure and the drift layer. This makes it possible to lessen electric-field concentration in the bottom of the trench. As a result, it is possible to reduce the occurrence of a reverse leakage current in the bottom of the trench.

The semiconductor device may further include a plurality of guard rings formed on an outer side toward an end surface of the semiconductor layer with respect to the terminal structure.

Preferably, the semiconductor device further includes a first conductivity type layer that is formed in the terminal structure and that is relatively higher in concentration than the terminal structure.

This arrangement makes it possible to widen the interval between equipotential surfaces that spread toward the end surface of the semiconductor layer, and hence makes it possible to lessen local electric-field concentration in the semiconductor layer.

The first conductivity type layer may include a highly-concentrated region that is formed so as to be exposed from the bottom surface of the removal region and that is higher in concentration than the first conductivity type layer. In this case, the highly-concentrated region may be formed in an area that is shallower than a depth position of 1000 Å from the bottom surface of the removal region.

The semiconductor device may include a field insulating film formed at the bottom surface of the removal region so as to selectively cover the terminal structure.

Preferably, when a contact hole that selectively exposes an all area of the active region and a part of the outer peripheral region is formed in the field insulating film, the contact hole is formed in a tapered shape whose width becomes greater toward an opening end. This arrangement makes it possible to raise the withstanding pressure of the semiconductor device.

The field insulating film may be made of $SiO_2$ (silicon oxide) or SiN (silicon nitride).

Preferably, the terminal structure has an impurity concentration different from an impurity concentration of the electric field relaxation layer, and is formed in a depth position that is the same as the electric field relaxation layer or in a position that is deeper than the electric field relaxation layer.

Preferably, an edge of the terminal structure, an edge of the surface electrode, and an edge of the first conductivity type layer are disposed in this order from the end surface of the semiconductor layer. This makes it possible to raise the withstanding pressure of the semiconductor device.

Preferably, the surface electrode forms an ohmic contact between the first conductivity type layer and the surface electrode.

The surface electrode may be formed so as to ride on the field insulating film so that the edge of the surface electrode is positioned on the field insulating film.

In the method for manufacturing a semiconductor device, the step of embedding the surface electrode in the trench may include a step of embedding polysilicon, or tungsten (W), or titanium (Ti), or an alloy of these elements according to a CVD method.

A semiconductor device according to another aspect of the present invention includes a semiconductor layer made of a wide bandgap semiconductor that has a surface partitioned into an active region and an outer peripheral region that surrounds the active region, a trench selectively formed on a surface portion of the semiconductor layer in the active region, a first conductivity type electric field relaxation layer formed so as to follow a part of or all of inner surfaces of the trench, a second conductivity type drift layer formed contiguously with the electric field relaxation layer so as to be exposed to the surface portion of the semiconductor layer, a surface electrode that is embedded in the trench so as to cover the surface portion of the semiconductor layer and that forms a Schottky junction between the drift layer and the surface electrode, a removal region formed at the surface portion of the semiconductor layer in the outer peripheral region, and a first conductivity type terminal structure formed so as to follow a bottom surface of the removal region, and the terminal structure has an impurity concentration different from an impurity concentration of the electric field relaxation layer, and is formed in a depth position that is the same as the electric field relaxation layer or in a position that is deeper than the electric field relaxation layer.

The semiconductor device may further include a plurality of guard rings formed on an outer side toward an end surface of the semiconductor layer with respect to the terminal structure.

Preferably, the semiconductor device further includes a first conductivity type layer that is formed in the terminal structure and that is relatively higher in concentration than the terminal structure, and the first conductivity type layer is disposed in a position inwardly away from an outer periphery of the terminal structure.

This arrangement makes it possible to widen the interval between equipotential surfaces that spread toward the end surface of the semiconductor layer, and hence makes it possible to lessen local electric-field concentration in the semiconductor layer.

The first conductivity type layer may include a highly-concentrated region that is formed so as to be exposed from the bottom surface of the removal region and that is higher in concentration than the first conductivity type layer.

Preferably, an edge of the terminal structure, an edge of the surface electrode, and an edge of the first conductivity type layer are disposed in this order from the end surface of the semiconductor layer. This makes it possible to raise the withstanding pressure of the semiconductor device.

Preferably, the surface electrode forms an ohmic contact between the first conductivity type layer and the surface electrode.

The semiconductor device may include a field insulating film formed at the bottom surface of the removal region so as to selectively cover the terminal structure. In this case, the surface electrode may be formed so as to ride on the field insulating film so that the edge of the surface electrode is positioned on the field insulating film.

BRIEF DESCRIPTION OF DRAWINGS

FIG. 4 is a schematic view showing a unit cell having a crystal structure of 4H—SiC.

DESCRIPTION OF EMBODIMENTS

Preferred embodiments of the present invention will be hereinafter described in detail with reference to the accompanying drawings.

Figure 1:
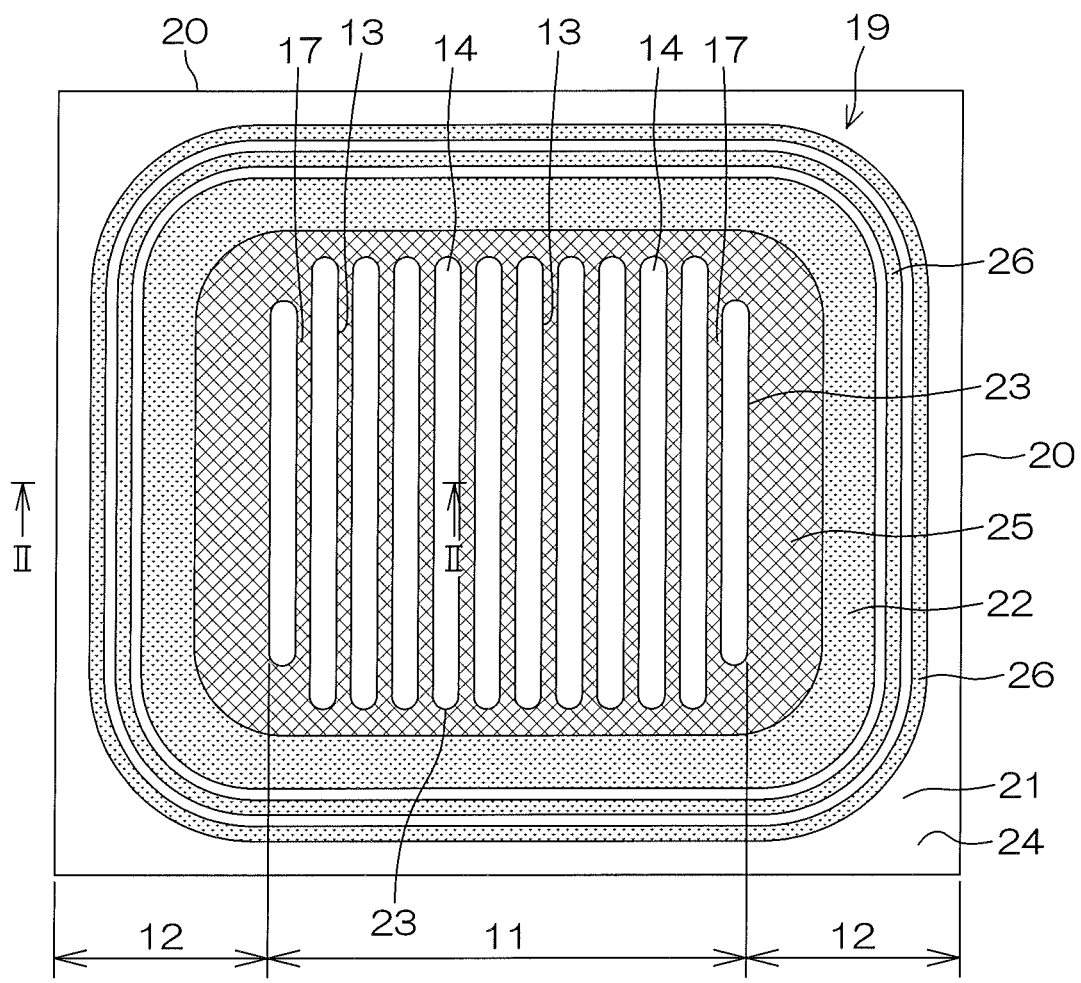
FIG. 1 is a schematic plan view of a semiconductor device according to a first preferred embodiment of the present invention.
Figure 2:
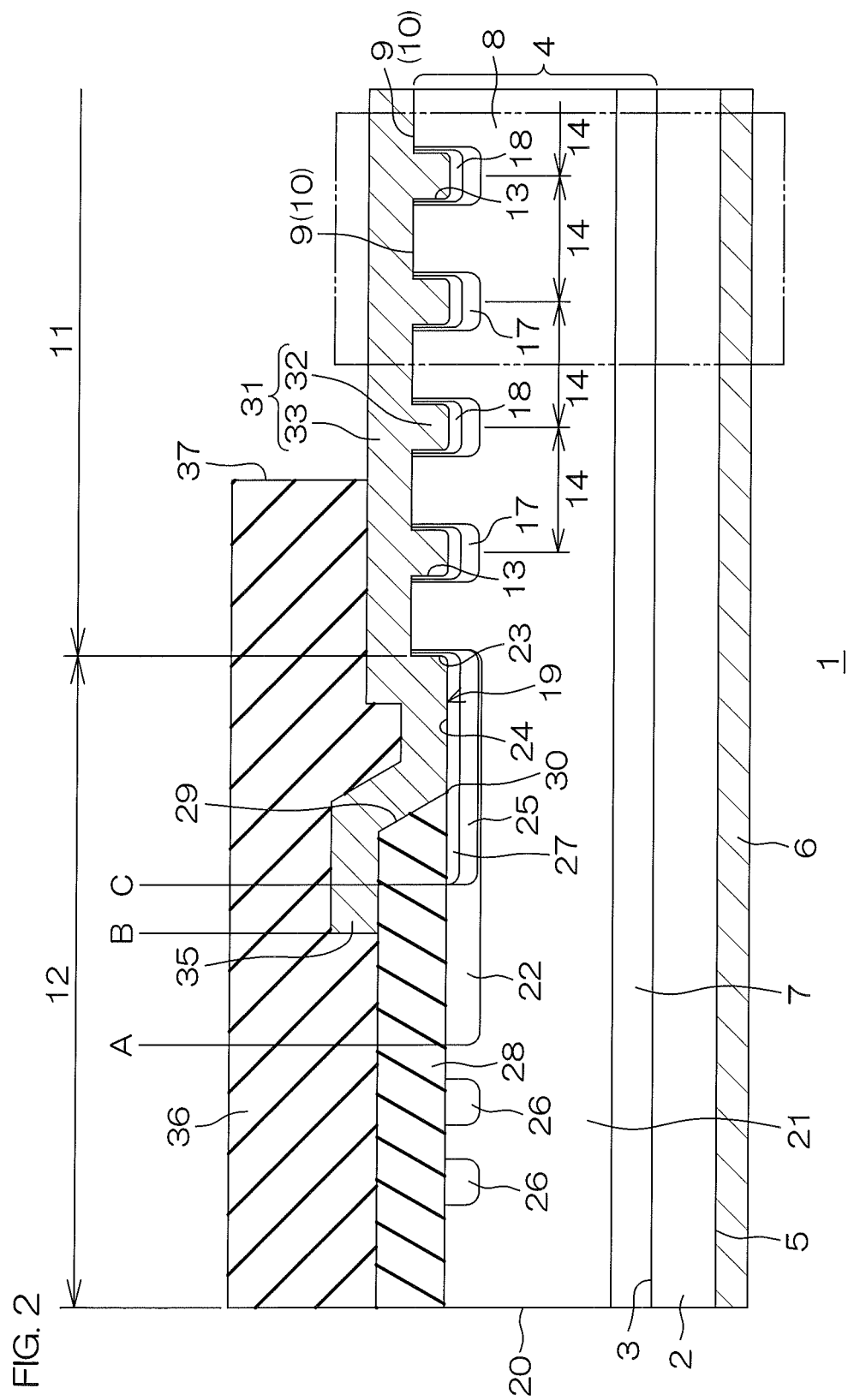
FIG. 2 is a cross-sectional view seen from the cross-section line II-II of FIG. 1.
Figure 3:
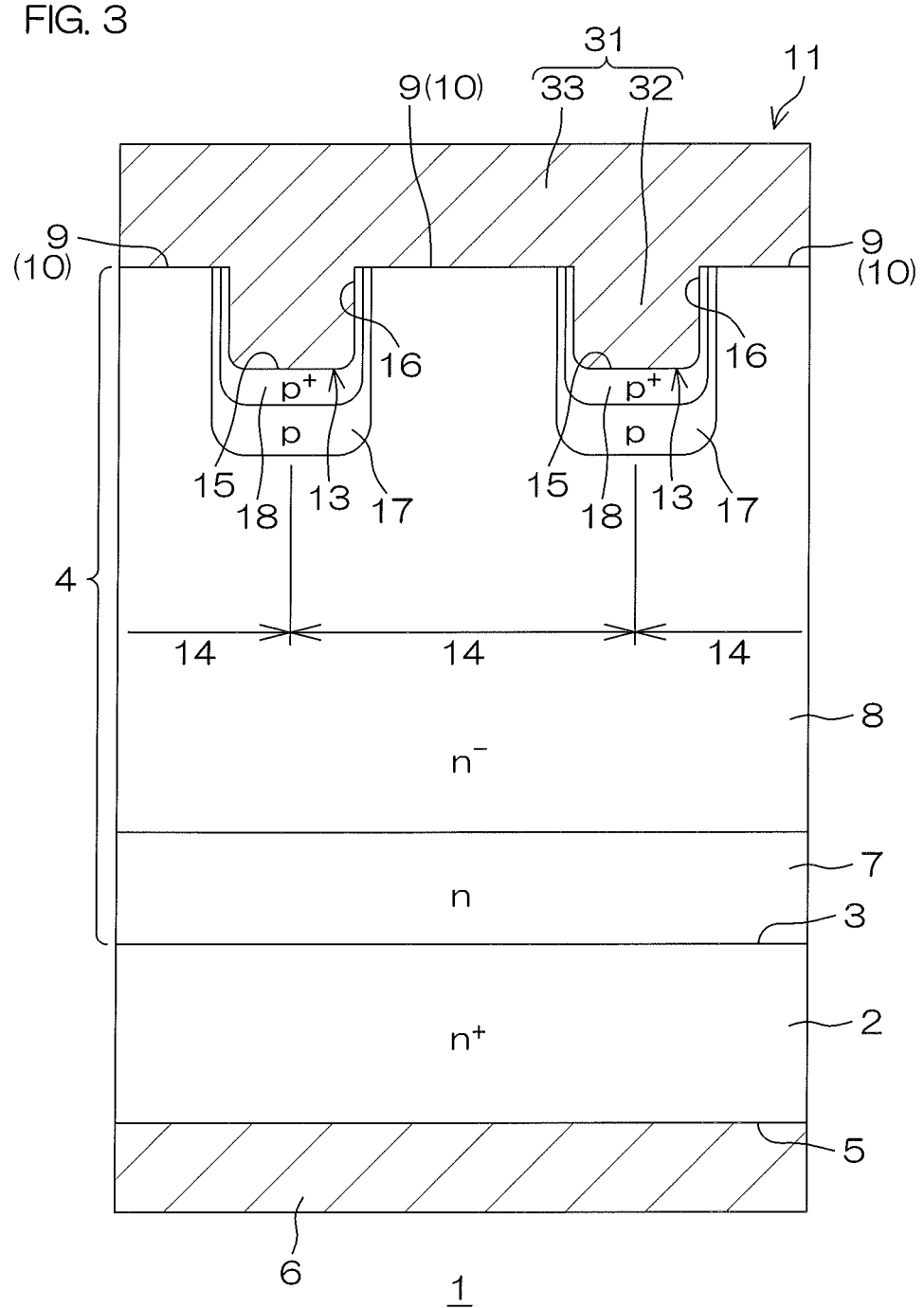
FIG. 3 is an enlarged view of a part surrounded by the alternate long and two short dashes line of FIG. 2.

FIG. 1 is a schematic plan view of a semiconductor device 1 according to a first preferred embodiment of the present invention. FIG. 2 is a cross-sectional view seen from the cross-section line II-II of FIG. 1. FIG. 3 is an enlarged view of a part surrounded by the alternate long and two short dashes line of FIG. 2.

The semiconductor device 1 is a device that employs 4H—SiC (a wide bandgap semiconductor whose insulation breakdown electric field is about 2.8 MV/cm and whose bandgap width is about 3.26 eV). The wide bandgap semiconductor employed by the semiconductor device 1 may be, for example, GaN, $Ga_2O_3$, diamond, etc., without being limited to SiC. In GaN, its insulation breakdown electric field is about 3 MV/cm, and its bandgap width is about 3.42 eV. In $Ga_2O_3$, its bandgap width is about 4.8 eV. In diamond, its insulation breakdown electric field is about 8 MV/cm, and its bandgap width is about 5.47 eV.

The semiconductor device 1 includes an $n^+$ type substrate 2 made of $n^+$ type SiC and an epitaxial layer 4 stacked on a surface 3 of the $n^+$ type substrate 2. In the present preferred embodiment, the $n^+$ type substrate 2 and the epitaxial layer 4 are shown as one example of the semiconductor layer of the present invention. A cathode electrode 6 is disposed on a back surface 5 of the $n^+$ type substrate 2 so as to cover its whole area. The cathode electrode 6 forms an ohmic contact between the $n^+$ type substrates 2 and the cathode electrode 6. Here, the $n^+$ type substrate 2 will be specifically described.

SiC that forms the $n^+$ type substrate 2 is a material showing a polytype that assumes various layered structures while having the same composition, and more than several hundred kinds of polytypes exist. In the present preferred embodiment, the $n^+$ type substrate 2 is 4H—SiC, and yet, without being limited to this, may be, for example, 3C—SiC, 2H—SiC, 6H—SiC, 15R—SiC, etc. Among these examples, it is preferable to employ hexagonal SiC such as 6H—SiC.

Figure 5:
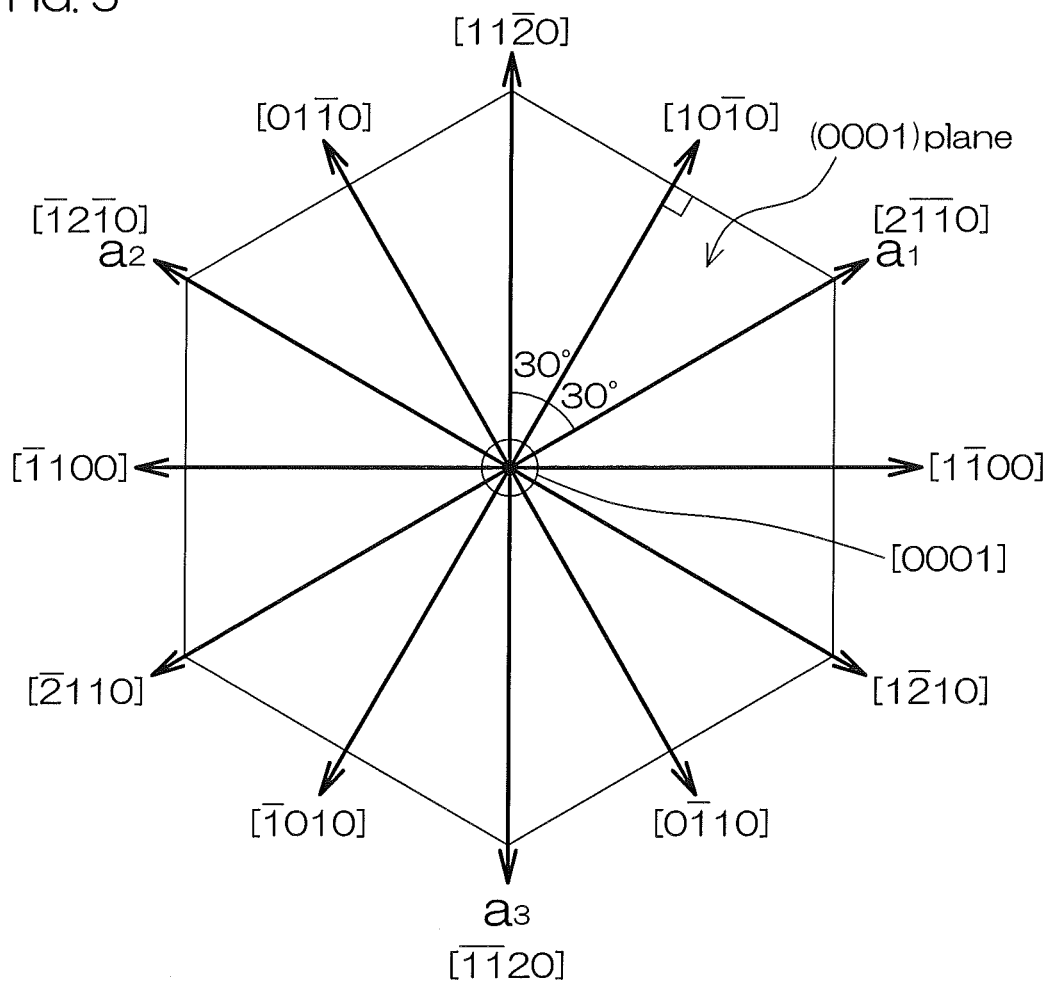
FIG. 5 is a view of the unit cell of FIG. 4 viewed from directly above a (0001) plane.

FIG. 4 is a schematic view showing a unit cell having a crystal structure of 4H—SiC. FIG. 5 is a view of the unit cell of FIG. 4 viewed from directly above a (0001) plane. Concerning a perspective view of a SiC crystal structure shown in the lower part of FIG. 4, only two layers of four layers of a SiC layered structure shown aside of it are taken out and are shown there.

As shown in FIG. 4, the 4H—SiC crystal structure can be approximated in a hexagonal system, and four carbon atoms are combined with one silicon atom. The four carbon atoms are positioned in four vertexes of a regular tetrahedron in which the silicon atom is disposed in the center. Concerning these four carbon atoms, one silicon atom is positioned in the direction of a [0001] axis with respect to one carbon atom, and the other three carbon atoms are positioned on the [000-1] axis side with respect to the silicon atom.

The [0001] axis and the [000-1] axis extend along the axial direction of a hexagonal prism, and the plane (top surface of the hexagonal prism) that defines this [0001] as a normal is a (0001) plane (Si plane). On the other hand, the plane (undersurface of the hexagonal prism) that defines the [000-1] axis as a normal is a (000-1) plane (C plane).

Directions that are perpendicular to the [0001] axis and that pass through mutually not-adjoining vertexes of the hexagonal prism when seen from immediately above the (0001) plane are an $a_1$ axis [2-1-10], an $a_2$ axis [-12-10], and an $a_3$ axis [-1-120], respectively.

As shown in FIG. 5, the direction passing through the vertex between the $a_1$ axis and the $a_2$ axis is a [11-20] axis, and the direction passing through the vertex between the $a_2$ axis and the $a_3$ axis is a [-2110] axis, and the direction passing through the vertex between the $a_3$ axis and the $a_1$ axis is a [1-210] axis.

Axes each of which is inclined at an angle of 30° with respect to each axis on the both sides in each space between the six axes respectively passing through the vertexes of the hexagonal prism and that is defined as a normal of each side surface of the hexagonal prism are a [10-10] axis, a [1-100] axis, a [0-110] axis, a [-1010] axis, a [-1100] axis, and a [01-10] axis, respectively, in clockwise order from between the $a_1$ axis and the [11-20] axis. Each plane (side surface of the hexagonal prism) that defines each of these axes as a normal is a crystal plane perpendicular to the (0001) plane and to the (000-1) plane.

In the present preferred embodiment, the n+ type substrate 2 has a predetermined off-angle θ (for example, θ=0° to 10°). More specifically, the principal plane of the n+ type substrate 2 (surface 3) is a plane inclined at an angle θ in an off direction of the [11-20] axis with respect to the (0001) plane. The off direction denotes a direction in which the normal n of the n+ type substrate 2 is inclined with respect to the [0001] axis as shown in FIG. 4, and is shown by the direction of a vector in which the normal n is projected (is cast) from the [0001] axis to the (0001) plane. In other words, in the present preferred embodiment, the direction of a projected vector of the normal n coincides with the [11-20] axis.

As a result, the n+ type substrate 2 is formed of a flat terrace plane consisting of the (0001) plane and a stepped part of the terrace plane that is generated by the inclination (off-angle θ) of the surface with respect to the (0001) plane, and the stepped part has a step plane that is a (11-20) plane perpendicular to the [11-20] axis.

The epitaxial layer 4 includes an n type buffer layer 7 and an n− type drift layer 8 that are grown in order from the side of the n+ type substrate 2.

An active region 11 and an outer peripheral region 12 that surrounds the active region 11 are set on the surface 10 of the epitaxial layer 4. In the active region 11, a plurality of mutually spaced trenches 13 are formed on the surface portion of the epitaxial layer 4.

Figure 6A:
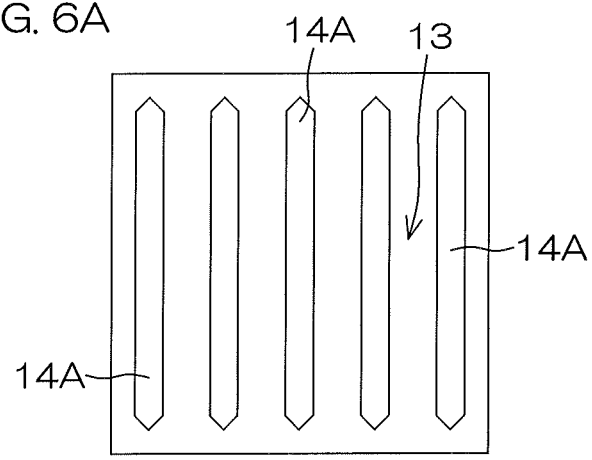
FIG. 6A is a layout view of the unit cell of FIG. 1.

The trench 13 defines a plurality of unit cells 14 in the active region 11. In the present preferred embodiment, the trench 13 having a stripe pattern defines a plurality of line-shaped unit cells 14 in the active region 11. As a result, the unit cells 14 are arranged in a stripe manner so as to be equally spaced as shown in FIG. 1 and FIG. 6A. The unit cells 14 may be arranged in a zigzag manner so that the adjoining unit cells 14 are staggered as shown in, for example, FIG. 6B and FIG. 6C.

Figure 6B:
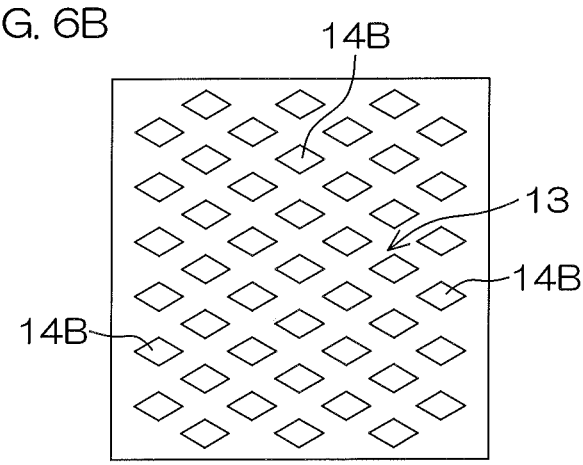
FIG. 6B is a layout view of the unit cell of FIG. 1.
Figure 6C:
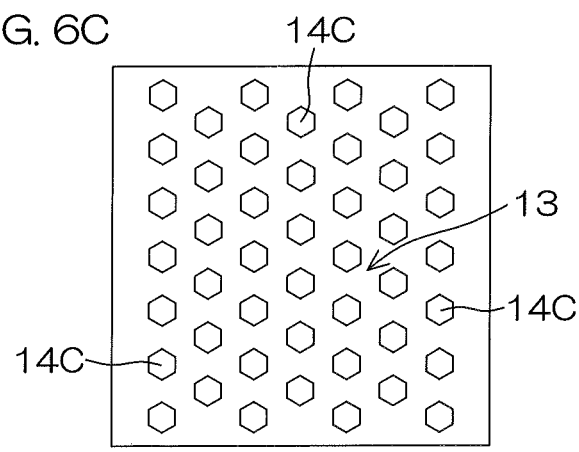
FIG. 6C is a layout view of the unit cell of FIG. 1.

Additionally, the planar shape of the unit cell 14 may be, for example, a linear unit cell 14A shown in FIG. 6A, a rhombic unit cell 14B shown in FIG. 6B, or a hexagonal unit cell 14C shown in FIG. 6C.

Still additionally, in the present preferred embodiment, a side surface 16 (which is the same as the side surface of the unit cell 14) of the trench 13 is formed of only a plurality of planes having plane orientations crystallographically equivalent to each other. More specifically, it is possible to describe this with reference to FIG. 7A to FIG. 7C showing parts of the unit cells 14A to 14C of FIG. 6A to FIG. 6C.

Figure 7A:
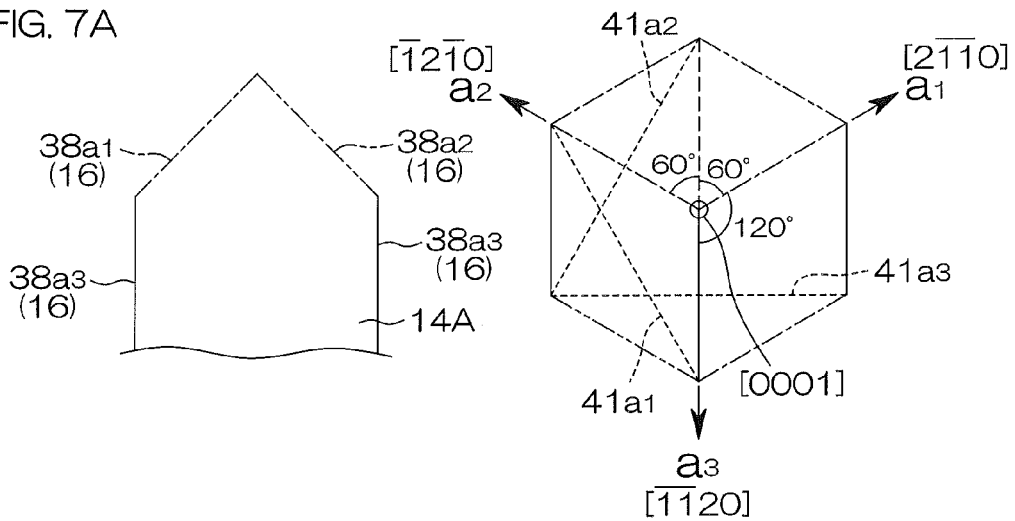
FIG. 7A is a view to describe the plane orientation of a side surface of the unit cell.

First, in FIG. 7A, the unit cell 14A (linear) consists of three kinds of side surfaces that differ from each other. These side surfaces are a side surface $38a_1$ (alternate long and short dash line) parallel to the $a_1$ axis, a side surface $38a_2$ (alternate long and two short dashes line) parallel to the $a_2$ axis, and a side surface $38a_3$ (solid line) parallel to the $a_3$ axis, respectively. In other words, the unit cell 14A is defined by these side surfaces $38a_1$, $38a_2$, and $38a_3$. These side surfaces $38a_1$, $38a_2$, and $38a_3$ are parallel to any one of the $a_1$ axis, the $a_2$ axis, and the $a_3$ axis that intersect each other at an angle of 120°, and hence have a relationship in which these side surfaces move to each other as a result of a symmetry operation in which a rotation of 60° is made around the [0001] axis. For example, if the side surface $38a_1$ is allowed to make a clockwise rotation of 60° upon the [0001] axis, it coincides with the side surface $38a_2$. The same applies to the symmetry operation from the side surface $38a_2$ to the side surface $38a_3$, and applies to the symmetry operation from the side surface $38a_3$ to the side surface $38a_1$.

Figure 7B:
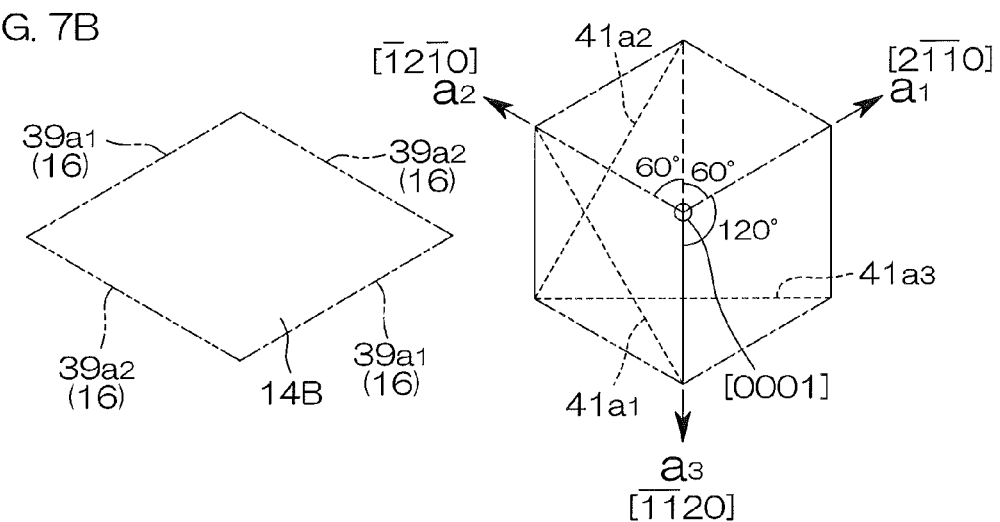
FIG. 7B is a view to describe the plane orientation of a side surface of the unit cell.

In FIG. 7B, the unit cell 14B (rhombic) consists of two kinds of side surfaces that differ from each other. These side surfaces are a side surface $39a_1$ (alternate long and short dash line) parallel to the $a_1$ axis and a side surface $39a_2$ (alternate long and two short dashes line) parallel to the $a_2$ axis, respectively. In other words, the unit cell 14B is defined by these side surfaces $39a_1$ and $39a_2$. These side surfaces $39a_1$ and $39a_2$ have a relationship in which these side surfaces move to each other as a result of a symmetry operation in which a rotation of 60° is made around the [0001] axis like the relationship between the side surface $38a_1$ and the side surface $38a_2$.

Figure 7C:
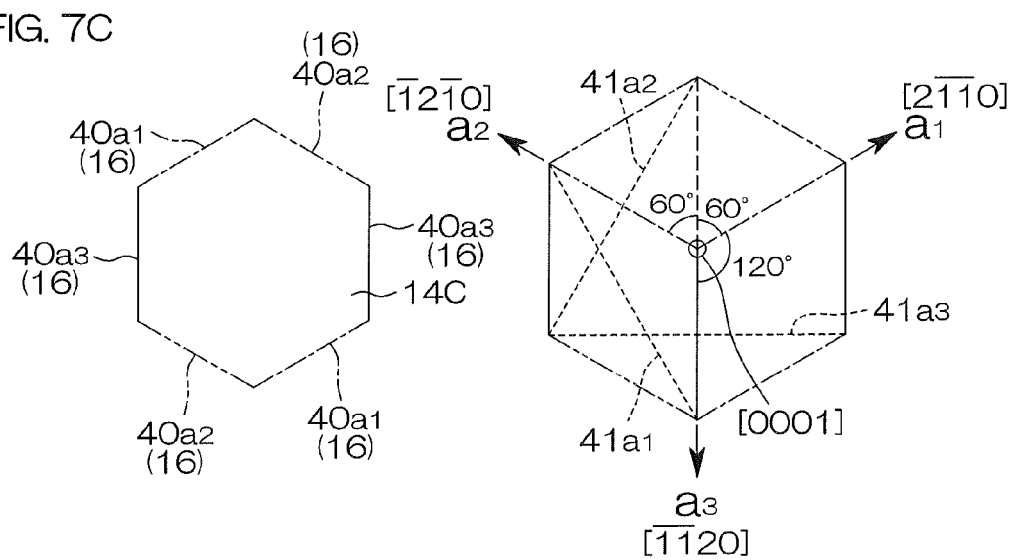
FIG. 7C is a view to describe the plane orientation of a side surface of the unit cell.

In FIG. 7C, the unit cell 14C (hexagonal) consists of three kinds of side surfaces that differ from each other. These side surfaces are a side surface $40a_1$ (alternate long and short dash line) parallel to the $a_1$ axis, a side surface $40a_2$ (alternate long and two short dashes line) parallel to the $a_2$ axis, and a side surface $40a_3$ (solid line) parallel to the $a_3$ axis, respectively. In other words, the unit cell 14C is defined by these side surfaces $40a_1$, $40a_2$, and $40a_3$. These side surfaces $40a_1$, $40a_2$, and $40a_3$ have a relationship in which these side surfaces move to each other as a result of a symmetry operation in which a rotation of 60° is made around the [0001] axis like the relationship among the side surface $38a_1$, the side surface $38a_2$, and the side surface $38a_3$.

The plurality of surfaces having a relationship in which the surfaces move to each other as a result of a symmetry operation in which a rotation of 60° is made around the [0001] axis are, for example, three kinds of side surfaces, i.e., a side surface $41a_1$ perpendicular to the $a_1$ axis, a side surface $41a_2$ perpendicular to the axis $a_2$, and a side surface $41a_3$ perpendicular to the axis $a_3$ as shown by the broken lines in FIG. 7A to FIG. 7C, respectively.

A p type layer 17 (i.e., cross-hatched area in FIG. 1 (excluding the area of a p type JTE structure 22 described later)) that is one example of an electric field relaxation layer of the present invention is formed at a bottom surface 15 and a side surface 16 of each trench 13 (hereinafter, these side surfaces are generically referred to as the "inner surfaces of the trench 13" when necessary) so as to follow the inner surfaces of the trench 13.

The p type layer 17 is formed at the whole of the bottom surface 15 and the whole of the side surface 16 of the trench 13. In the present preferred embodiment, the p type layer 17 is formed such that an n− type drift layer 8 is not exposed from the bottom surface 15 and the side surface 16 of the trench 13. As a result, the p type layer 17 is exposed to the side surface 16 of the trench 13 from the bottom of the trench 13 to the surface 10 of the epitaxial layer 4. The p type layer 17 forms a pn junction portion between the n− type drift layer 8 and the p type layer 17.

Additionally, the p type layer 17 includes a p+ type contact layer 18 that is one example of a highly-concentrated layer of the present invention that is higher in concentration than other parts of the p type layer 17. In the inner area away from the boundary between the p type layer 17 and the n− type drift layer 8, the p+ type contact layer 18 is formed at the bottom surface 15 and the side surface 16 of the trench 13 along that boundary. More specifically, the p+ type contact layer 18 is formed in an area that is shallower than the depth position of 1000 Å from the inner surface of the trench 13.

The p type layer 17 has mutually different thicknesses between the bottom surface 15 and the side surface 16 of the trench 13. More specifically, a part on the bottom surface 15 of the p type layer 17 is thicker than a part on the side surface 16. As a result, a difference in thickness of the p type layer 17 is provided between the bottom surface 15 and the side surface 16. Likewise, concerning the p+ type contact layer 18 formed inside the p type layer 17, a difference in thickness is provided between the bottom surface 15 and the side surface 16.

In an outer peripheral region 12, a removal region 19 is formed in the epitaxial layer 4 by etching the epitaxial layer 4 from the surface 10 to a depth to which the n− type drift layer 8 is exposed. In the present preferred embodiment, the removal region 19 is formed in an annular shape surrounding the active region 11 so as to cross both ends in the longitudinal direction of the stripe-patterned trench 13. As a result, the removal region 19 connects to the stripe-patterned trench 13. In other words, the removal region 19 is formed of an extension of the stripe pattern. An outer peripheral edge of the removal region 19 may coincide with an end surface 20 of the epitaxial layer 4 as shown in FIG. 1, or may be set inside the end surface 20 of the epitaxial layer 4 (not shown).

As a result of the formation of the removal region 19, the n− type drift layer 8 has a drawer portion 21 that is drawn out from the periphery of the active region 11 to the end surface 20 of the epitaxial layer 4 in the lateral direction along the surface 10 of the epitaxial layer 4. The drawer portion 21 is a low stepped portion that is lower by one step than the surface 10 of the epitaxial layer 4.

In the outer peripheral region 12, a p type JTE (Junction Termination Extension) structure 22 (cross-hatched area in FIG. 1) that is one example of a terminal structure of the present invention and a plurality of guard rings 26 are formed in the n− type drift layer 8. In the present preferred embodiment, the p type JTE structure 22 and the guard rings 26 are formed in this order from the side of the active region 11 in an annular shape surrounding the active region 11.

More specifically, the p type JTE structure 22 is formed to follow the side surface 23 and the bottom surface 24 (upper surface of the drawer portion 21) of the removal region 19 in such a manner as to straddle the unit cell 14 and the drawer portion 21. The guard rings 26 are formed so as to further surround the p type JTE structure 22. The p type JTE structure 22 may be formed so that the dopant concentration is constant over its whole, or may be formed so that the dopant concentration becomes smaller toward the outside. The dopant concentration of the guard rings 26 may be the same as the p type JTE structure 22, or may be smaller than the p type JTE structure 22.

In the present preferred embodiment, a p type layer 25 (cross-hatched area in FIG. 1) that is one example of the first conductivity type layer of the present invention and that is relatively higher in concentration than the p type JTE structure 22 is formed in the p type JTE structure 22.

The p type layer 25 is formed so as to follow the side surface 23 and the bottom surface 24 (upper surface of the drawer portion 21) of the removal region 19. Additionally, the p type layer 25 is disposed at a position inwardly away from the outer periphery of the p type JTE structure 22. This makes it possible to widen the interval between equipotential surfaces that spread toward the end surface 20 of the epitaxial layer 4, and hence makes it possible to lessen local electric-field concentration in the epitaxial layer 4.

A p+ type contact layer 27 that is one example of the highly-concentrated region of the present invention and that is higher in concentration than the p type layer 25 is formed in the p type layer 25. In the inner area away from the boundary between the p type JTE structure 22 and the n− type drift layer 8, the p+ type contact layer 27 is formed at the side surface 23 and the bottom surface 24 of the removal region 19 along that boundary. More specifically, the p+ type contact layer 27 is formed in an area that is shallower than the depth position of 1000 Å from the inner surface of the removal region 19.

A field insulating film 28 is formed on the epitaxial layer 4. A contact hole 29 that selectively exposes all of the active region 11 and a part of the outer peripheral region 12 is formed in the field insulating film 28. In the present preferred embodiment, the outer peripheral edge 30 of the contact hole 29 is set on the side closer to the active region 11 with respect to the boundary (p type layer edge C (outer peripheral edge of the p type layer 25)) between the p type layer 25 and the p type JTE structure 22. As a result, the field insulating film 28 covers a part (e.g., peripheral end) of the p type layer 25. Preferably, the contact hole 29 is formed in a tapered shape whose width becomes wider toward its opening end.

An anode electrode 31 that is one example of the surface electrode of the present invention is formed on the field insulating film 28. The anode electrode 31 is formed so as to cover the whole of the active region 11 exposed from the contact hole 29, and integrally includes an embedded portion 32 embedded in the trench 13 and a planar portion 33 that is formed so as to cover the embedded portion 32 while following the surface 10 of the epitaxial layer 4.

The embedded portion 32 is in contact with the p+ type contact layer 18 in the inner surface of the trench 13, and forms an ohmic contact between the p+ type contact layer 18 and the embedded portion 32.

The planar portion 33 is in contact with the n− type drift layer 8 in the upper surface 9 of the unit cell 14 (the surface 10 of the epitaxial layer 4), and forms a Schottky junction between the n− type drift layer 8 and the planar portion 33. Additionally, the planar portion 33 projects in a flange shape outwardly from the contact hole 29, and rides on the field insulating film 28. In the present preferred embodiment, the outer peripheral edge (electrode edge B) of the planar portion 33 of the anode electrode 31 is positioned on the side closer to the active region 11 with respect to the outer peripheral edge (JTE edge A) of the p type JTE structure 22, and is positioned on the side farther from the active region 11 with respect to the outer peripheral edge (p type layer edge C) of the p type layer 25. In other words, the positional relationship among these edges is the JTE edge A, the electrode edge B, and the p type layer edge C in order from the end surface 20 (outside). As a result, the planar portion 33 of the anode electrode 31 has an overlap portion 35 that bulges out toward the end surface 20 beyond the p type layer edge C.

A surface protection film 36 is formed on the topmost surface of the semiconductor device 1. A pad opening 37 that selectively exposes a part of the anode electrode 31 as a pad is formed in the surface protection film 36. A bonding wire and so forth are bonded to the anode electrode 31 through the pad opening 37.

Details of each portion of the semiconductor device 1 will be hereinafter described.

The semiconductor device 1 is formed in a square chip shape when viewed planarly. Concerning its size, lengths in up, down, right, and left directions in the sheet of FIG. 1 are each 0.5 mm to 20 mm. In other words, the chip size of the semiconductor device 1 is, for example, 0.5 mm/square to 20 mm/square.

The thickness of the n$^+$ type substrate 2 is 50 μm to 700 μm, the thickness of the n type buffer layer 7 is 0.1 μm to 10 μm, and the thickness of the n$^-$ type drift layer 8 is 2 μm to 100 μm.

For example, N (nitrogen), P (phosphorus), As (arsenic), etc., can be used as an n type dopant for use in each portion of the semiconductor device 1 (the same applies hereinafter). On the other hand, for example, B (boron), Al (aluminum) etc., can be used as a p type dopant.

The dopant concentration of the n$^+$ type substrate 2 is $1 \times 10^{18}$ to $1 \times 10^{20}$ cm$^{-3}$, the dopant concentration of the n type buffer layer 7 is $1 \times 10^{15}$ to $1 \times 10^{19}$ cm$^{-3}$, and the dopant concentration of the n$^-$ type drift layer 8 may be $1 \times 10^{14}$ to $1 \times 10^{17}$ cm$^{-3}$.

The dopant concentration of the p type layer 17 is $1 \times 10^{17}$ to $1 \times 10^{19}$ cm$^{-3}$, and the dopant concentration of the type contact layers 18 and 27 may be $1 \times 10^{19}$ to $3 \times 10^{21}$ cm$^{-3}$.

The dopant concentration of the p type layer 25 of the p type JTE structure 22 and of the guard ring 26 is $1 \times 10^{16}$ to $1 \times 10^{18}$ cm$^{-3}$.

The dopant concentration of the p type layer 25 may be $1 \times 10^{16}$ to $1 \times 10^{18}$ cm$^{-3}$.

The center-to-center pitch between mutually adjoining trenches 13 may be, for example, 2 μm to 20 μm. The depth of the trench 13 and the depth of the removal region 19 may be equal to each other.

For example, Ti/Ni/Au/Ag and so forth can be used as the material of the cathode electrode 6.

For example, Ti/Al and so forth can be used as the material of the anode electrode 31.

For example, SiO$_2$ (silicon oxide), SiN (silicon nitride), and so forth can be used as the material of the field insulating film 28. The field insulating film 28 can be made according to, for example, a plasma CVD. Its film thickness can be set at 0.5 μm to 3 μm.

For example, SiO$_2$ (silicon oxide), SiN (silicon nitride), polyimide, and so forth can be used as the material of the surface protection film 36. The surface protection film 36 can be made according to, for example, the plasma CVD. Its film thickness may be set at about 8000 Å.

Next, a method for manufacturing the semiconductor device 1 will be described.

Figure 8:
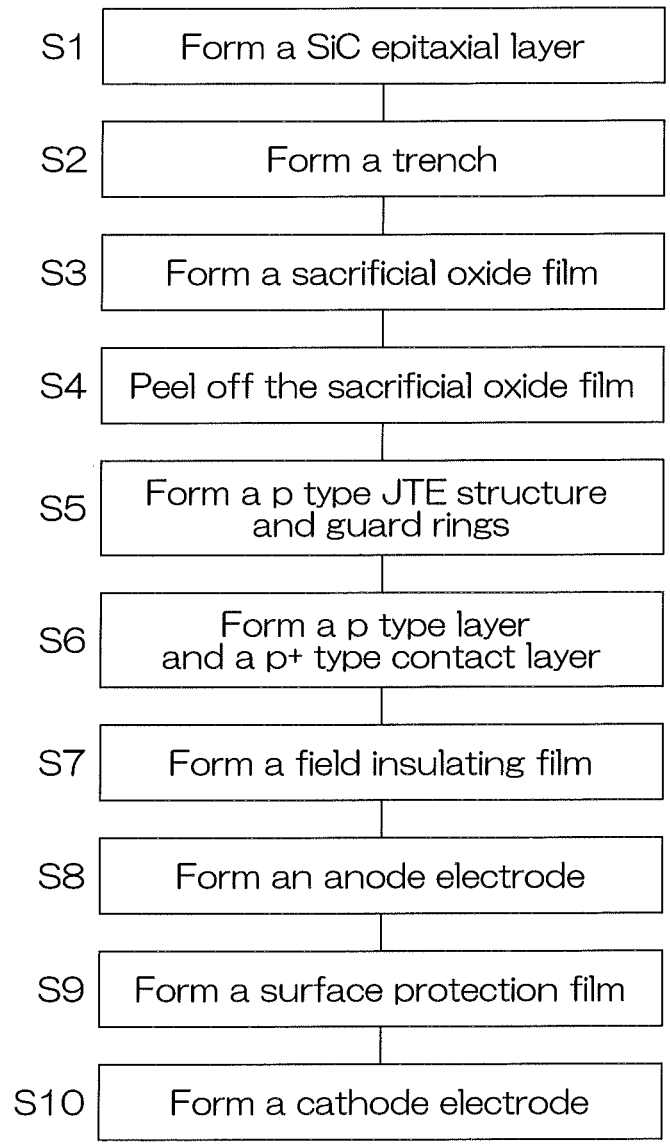
FIG. 8 is a flowchart to describe one example of a manufacturing process of the semiconductor device.
Figure 9A:
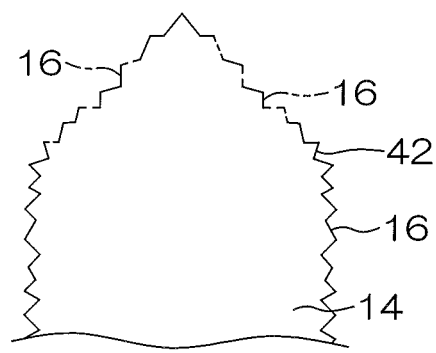
FIG. 9A is a plan view to describe a step relative to the formation of a trench and the formation of a sacrificial oxide film.
Figure 9B:
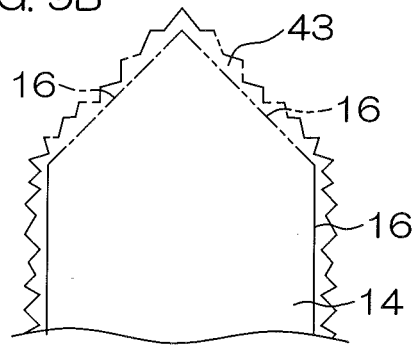
FIG. 9B is a view showing a step subsequent to that of FIG. 9A.
Figure 9C:
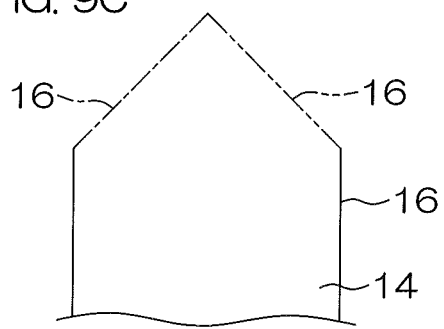
FIG. 9C is a view showing a step subsequent to that of FIG. 9B.

FIG. 8 is a flowchart to describe one example of a manufacturing process of the semiconductor device. FIG. 9A to FIG. 9C are plan views to describe steps relative to the formation of a trench and the formation of a sacrificial oxide film. In FIG. 9A to FIG. 9C, a linear unit cell 14 is shown as one example of the unit cell 14.

First, the n type buffer layer 7 and the n$^-$ type drift layer 8 undergo epitaxial growth in this order on the n$^+$ type substrate 2 that is in a wafer state (step S1).

Thereafter, as shown in FIG. 9A, a mask that has an opening according to the pattern of the trench 13 is formed, and a trench 13 is formed by an etching operation that uses this mask, and a unit cell 14 defined by the trench 13 is simultaneously formed (step S2). A plurality of side surfaces 16 (side surfaces of the unit cell 14) of the trench 13 have plane orientations that are crystallographically equivalent to each other, and therefore mutually-uniform damages 42 appear. At this time, the plane orientations of the side surfaces 16 of the trench 13 are crystallographically equivalent to each other, and therefore it is possible to make the side surfaces 16 of the trench 13 uniform so as to have the same anisotropic structure. Therefore, it is possible to make the degree of the damages 42 suffered by the side surfaces 16 of the trench 13 uniform during etching. In FIG. 9A to FIG. 9C, the side surfaces 16 shown by leader lines of the alternate long and short dash line, of the alternate long and two short dashes line, and of the solid line coincide with plane orientations of the side surface 38$a_1$, of the side surface 38$a_2$, and of the side surface 38$a_3$ shown in FIG. 7A, respectively. When the trench 13 is formed, the removal region 19 may be also formed simultaneously so as to have the same depth.

Thereafter, as shown in FIG. 9B, a sacrificial oxide film 43 is formed on the side surfaces 16 of the trench 13 by thermal oxidation (step S3). The plane orientations of the side surfaces 16 of the trench 13 are crystallographically equivalent to each other, and therefore the sacrificial oxide film 43 is formed with uniform film quality at a constant oxidation rate with respect to the side surfaces 16 of the trench 13.

Thereafter, as shown in FIG. 9C, the sacrificial oxide film 43 is peeled off (step S4). As a result, the plurality of side surfaces 16 in which the damages 42 have been improved at the same level appear.

Thereafter, the p type JTE structure 22, the guard ring 26, and a p type layer that is the same in shape as the p type layer 17 are simultaneously formed by selectively implanting impurities (in the present preferred embodiment, Al ions) into the inner surfaces of the trench 13 and the removal region 19 (step S5).

Thereafter, the p type layers 17, 25 and the p$^+$ type contact layers 18, 27 are simultaneously formed by forming a mask that has an opening according to the pattern of each of the p type layers 17, 25 and the p$^+$ type contact layers 18, 27 and by selectively implanting impurities (in the present preferred embodiment, Al ions) into the inner surfaces of the trench 13 and the removal region 19 by use of the mask (step S6).

Thereafter, a field insulating film 28 that has a contact hole 29 is formed on the surface 10 of the epitaxial layer 4 according to, for example, the thermal oxidation method or the CVD method (step S7). Thereafter, an ohmic contact, such as NiSi, is formed on the back surface 5 of the n$^+$ type substrate 2.

Thereafter, an anode electrode 31 is formed on the epitaxial layer 4 according to, for example, the sputtering method (step S8), and a surface protection film 36 that has a pad opening 37 is formed so as to cover the anode electrode 31 (step S9).

Finally, the semiconductor device 1 shown in FIG. 1 etc., is obtained by forming a cathode electrode 6 on the back surface 5 of the n$^+$ type substrate 2 (step S10).

In the semiconductor device 1 manufactured by the above-mentioned method, the damages 42 (see FIG. 9A) of the plurality of side surfaces 16 of the trench 13 are improved at the same level, and therefore it is possible to make physical properties of the side surfaces 16 even. Therefore, even if a reverse leakage current flows through the side surfaces 16 (side surface of the unit cell 14) of the trench 13, it is possible to reduce variations in this reverse leakage current.

Additionally, the unit cell 14 is defined by the trench 13, and therefore it is possible to lessen electric field concentration at the upper surface 9 of the unit cell 14. This makes it possible to weaken the electric field strength in the upper surface 9 of the unit cell 14, and hence makes it possible to reduce the reverse leakage current through the upper surface 9 of the unit cell 14. Additionally, it is possible to lower a barrier height between the unit cell 14 and the anode electrode 31 being in contact with the upper surface 9 of the unit cell 14, and therefore it is possible to reduce a forward voltage.

Additionally, it is possible to reduce a reverse leakage current through the inner surfaces (the bottom surface 15 and the side surface 16) of the trench 13 by means of the p type layer 17 formed by following the inner surfaces of the trench 13.

Additionally, it is possible to prevent equipotential surfaces from densely gathering between the trench 13 and the removal region 19 by means of a depletion layer generated from a pn junction portion of an interface between the p type JTE structure 22 and the n$^-$ type drift layer 8. This makes it possible to lessen electric field concentration in the bottom of the trench 13. As a result, it is possible to reduce the occurrence of a reverse leakage current in the bottom of the trench 13.

Figure 10:
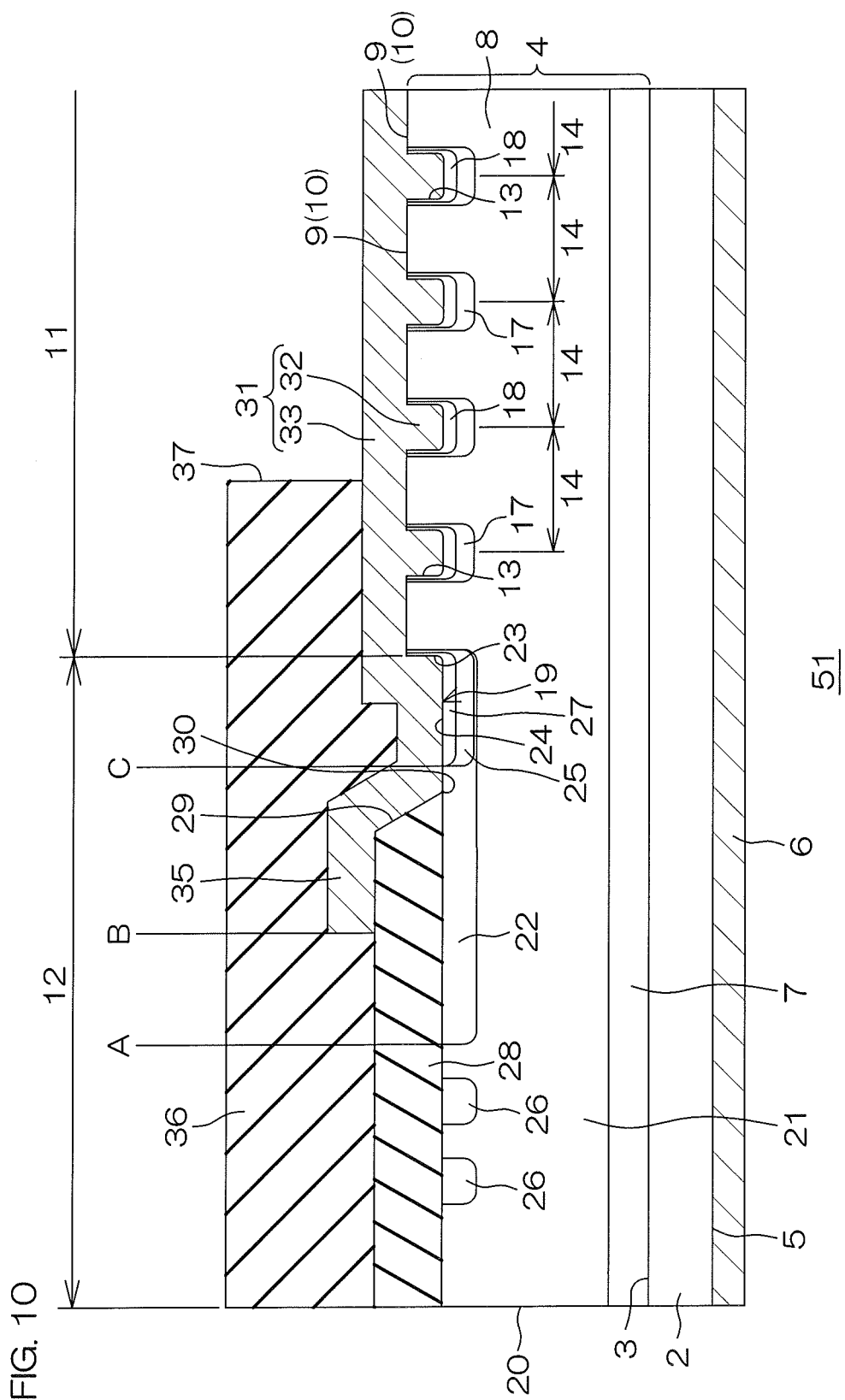
FIG. 10 is a schematic cross-sectional view of a semiconductor device according to a second preferred embodiment of the present invention.

FIG. 10 is a schematic cross-sectional view of a semiconductor device 51 according to a second preferred embodiment of the present invention. In FIG. 10, the same reference sign as in FIG. 2 is given to a component corresponding to each component of FIG. 2 shown above.

In the first preferred embodiment of FIG. 2, the outer peripheral edge 30 of the contact hole 29 was set on the side closer to the active region 11 with respect to the p type layer edge C. On the other hand, in the semiconductor device 51 of this second preferred embodiment, the outer peripheral edge 30 of the contact hole 29 is set on the side farther from the active region 11 with respect to the p type layer edge C of the p type layer 25 and the p type JTE structure 22. As a result, the field insulating film 28 selectively covers a part of the p type JTE structure 22, and exposes the whole of the p type layer 25.

This semiconductor device 51 also makes it possible to achieve the same effect as the semiconductor device 1 of the first preferred embodiment.

Figure 11:
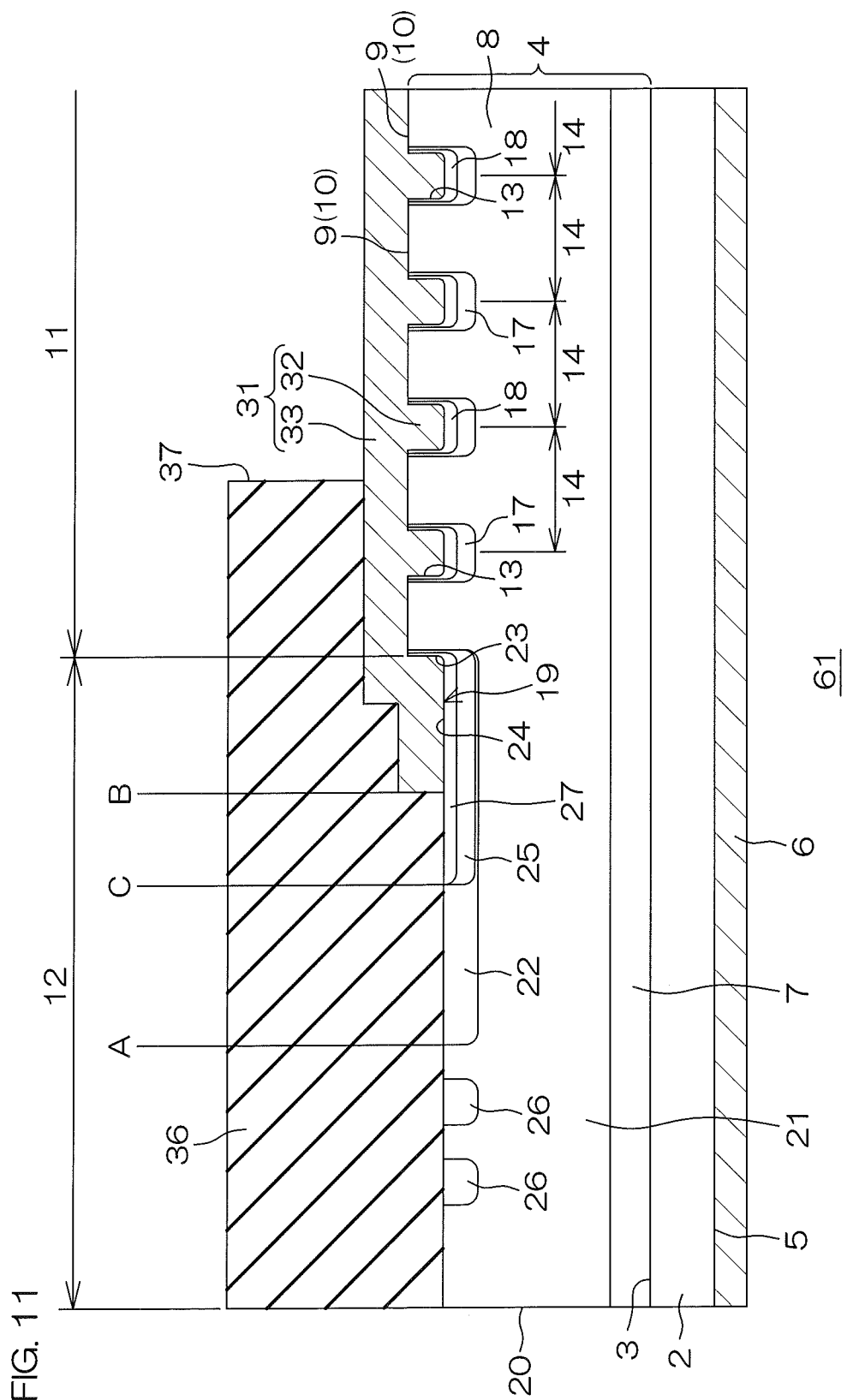
FIG. 11 is a schematic cross-sectional view of a semiconductor device according to a third preferred embodiment of the present invention.

FIG. 11 is a schematic cross-sectional view of a semiconductor device 61 according to a third preferred embodiment of the present invention. In FIG. 11, the same reference sign as in FIG. 3 is given to a component corresponding to each component of FIG. 3 shown above.

Although the field insulating film 28 was provided in the first preferred embodiment of FIG. 2, the field insulating film 28 is excluded in the semiconductor device 61 of this third preferred embodiment. The planar portion 33 of the anode electrode 31 is formed so as to be in contact with the side surface 23 and the bottom surface 24 of the removal region 19. The electrode edge B of the planar portion 33 is positioned on the side closer to the active region 11 with respect to the p type layer edge C of the p type layer 25. The surface protection film 36 is formed so as to be in contact with the bottom surface 24 of the removal region 19 exposed from the anode electrode 31.

This semiconductor device 61 also makes it possible to achieve the same effect as the semiconductor device 1 of the first preferred embodiment.

Figure 12:
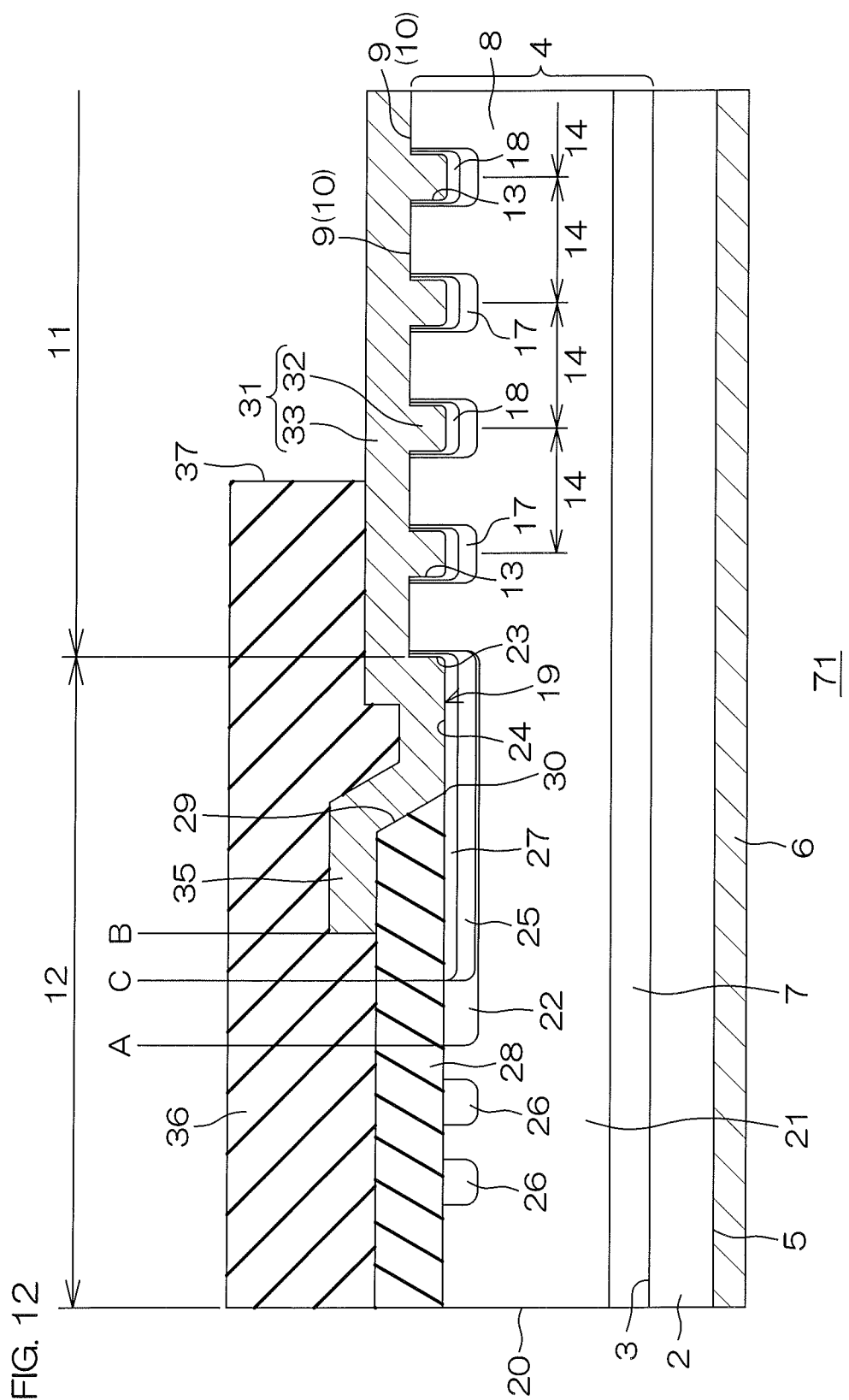
FIG. 12 is a schematic cross-sectional view of a semiconductor device according to a fourth preferred embodiment of the present invention.

FIG. 12 is a schematic cross-sectional view of a semiconductor device 71 according to a fourth preferred embodiment of the present invention. In FIG. 12, the same reference sign as in FIG. 2 is given to a component corresponding to each component of FIG. 2 shown above.

In the first preferred embodiment of FIG. 2, the electrode edge B of the planar portion 33 of the anode electrode 31 was positioned on the side farther from the active region 11 with respect to the p type layer edge C of the p type layer 25. On the other hand, in the semiconductor device 71 of this fourth preferred embodiment, the electrode edge B of the planar portion 33 of the anode electrode 31 is positioned on the side closer to the active region 11 with respect to the p type layer edge C of the p type layer 25. In other words, the overlap portion 35 is housed in an inner area of the p type layer 25.

This semiconductor device 71 also makes it possible to achieve the same effect as the semiconductor device 1 of the first preferred embodiment.

Figure 13:
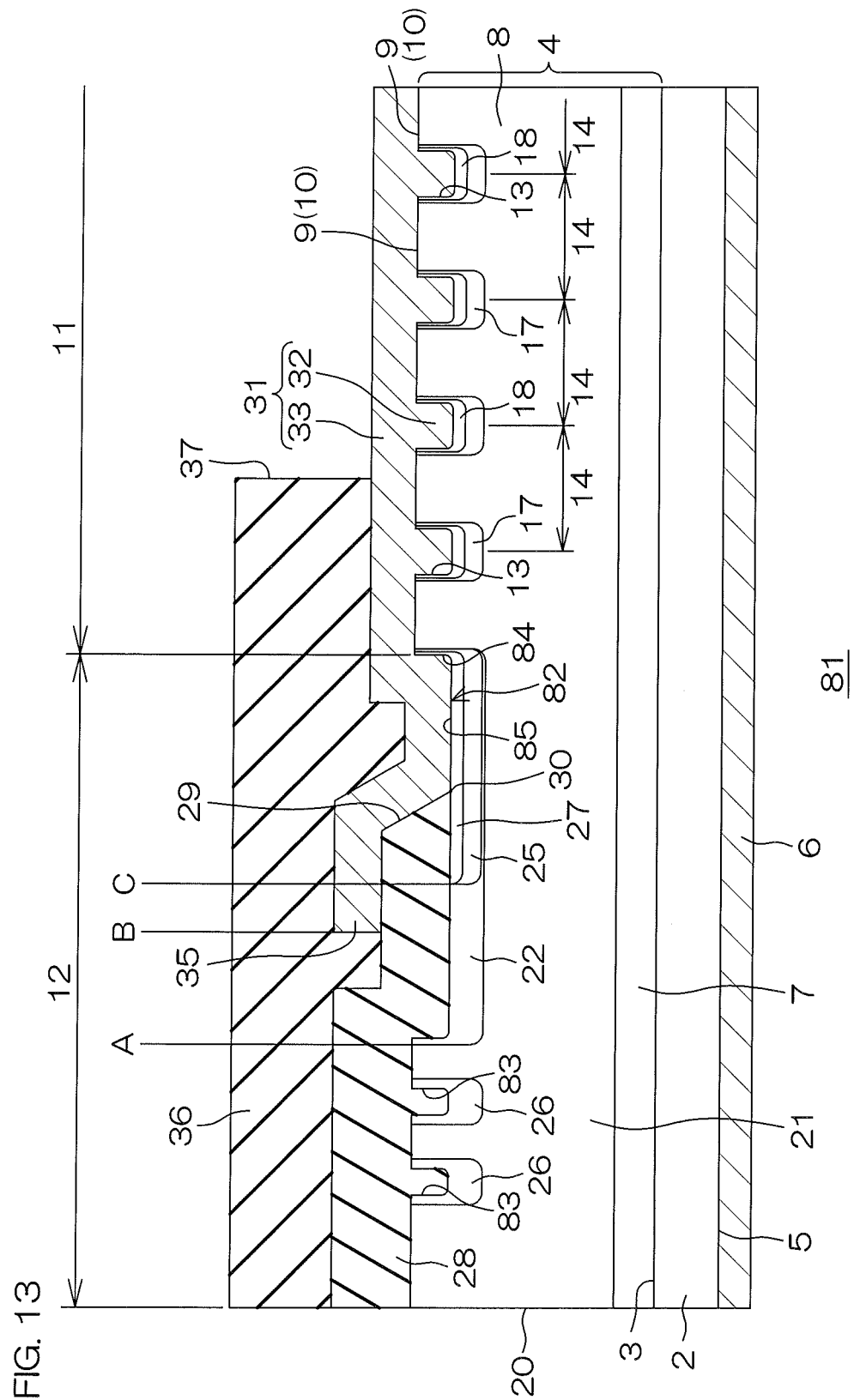
FIG. 13 is a schematic cross-sectional view of a semiconductor device according to a fifth preferred embodiment of the present invention.

FIG. 13 is a schematic cross-sectional view of a semiconductor device according to a fifth preferred embodiment of the present invention. In FIG. 13, the same reference sign as in FIG. 2 is given to a component corresponding to each component of FIG. 2 shown above.

In the first preferred embodiment of FIG. 2, the removal region 19 was formed in all area of the outer peripheral region 12 from the active region 11 to the end surface 20 so that its outer peripheral edge coincided with the end surface 20. On the other hand, in the semiconductor device 81 of this fifth preferred embodiment, a JTE trench 82, which is one example of the removal region of the present invention, and a guard ring trench 83 are selectively formed at a formation position of the p type JTE structure 22 and a formation position of the guard ring 26 in the outer peripheral region 12, respectively.

The p type JTE structure 22 is formed so as to follow the inner surfaces (the side surface 84 and the bottom surface 85) of the JTE trench 82, and the guard ring 26 is formed so as to follow the inner surfaces (the bottom surface and the side surface) of the guard ring trench 83. Although the p type JTE structure 22 and the guard ring 26 are formed on the entire inner surfaces of the trenches 82 and 83, respectively, in the present preferred embodiment, these may be selectively formed on only one part of the inner surfaces. The field insulating film 28 is formed so as to be embedded in the JTE trench 82 and in the guard ring trench 83.

This semiconductor device 81 also makes it possible to achieve the same effect as the semiconductor device 1 of the first preferred embodiment.

Figure 14:
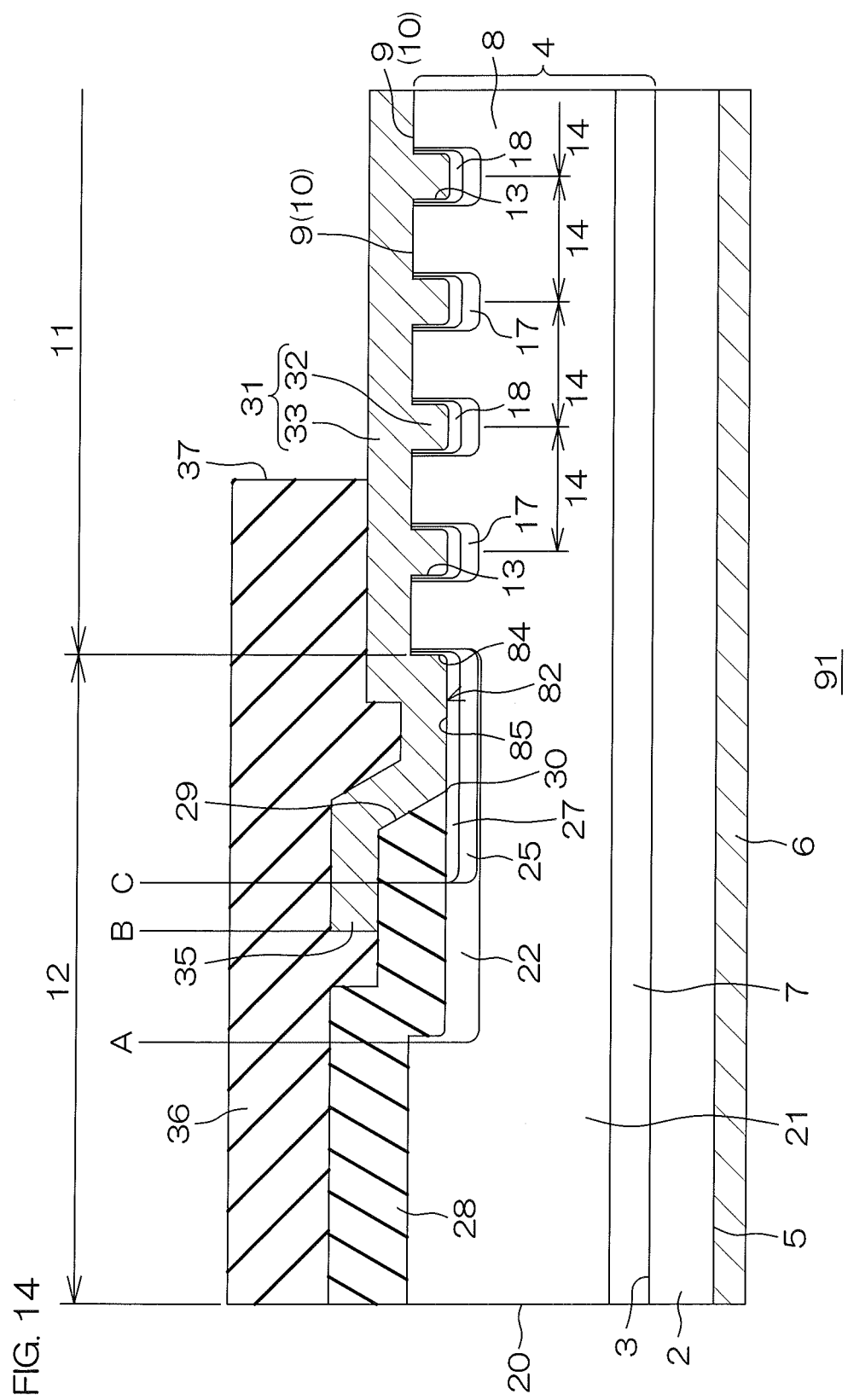
FIG. 14 is a schematic cross-sectional view of a semiconductor device according to a sixth preferred embodiment of the present invention.

FIG. 14 is a schematic cross-sectional view of a semiconductor device according to a sixth preferred embodiment of the present invention. In FIG. 14, the same reference sign as in FIG. 2 and in FIG. 13 is given to a component corresponding to each component of FIG. 2 and FIG. 13 shown above.

Although the plurality of guard rings 26 were formed outside the p type JTE structure 22 in the fifth preferred embodiment of FIG. 13, the guard rings 26 are excluded in the semiconductor device 91 of this sixth preferred embodiment. This semiconductor device 91 also makes it possible to achieve the same effect as the semiconductor device 1 of the first preferred embodiment.

Figure 15:
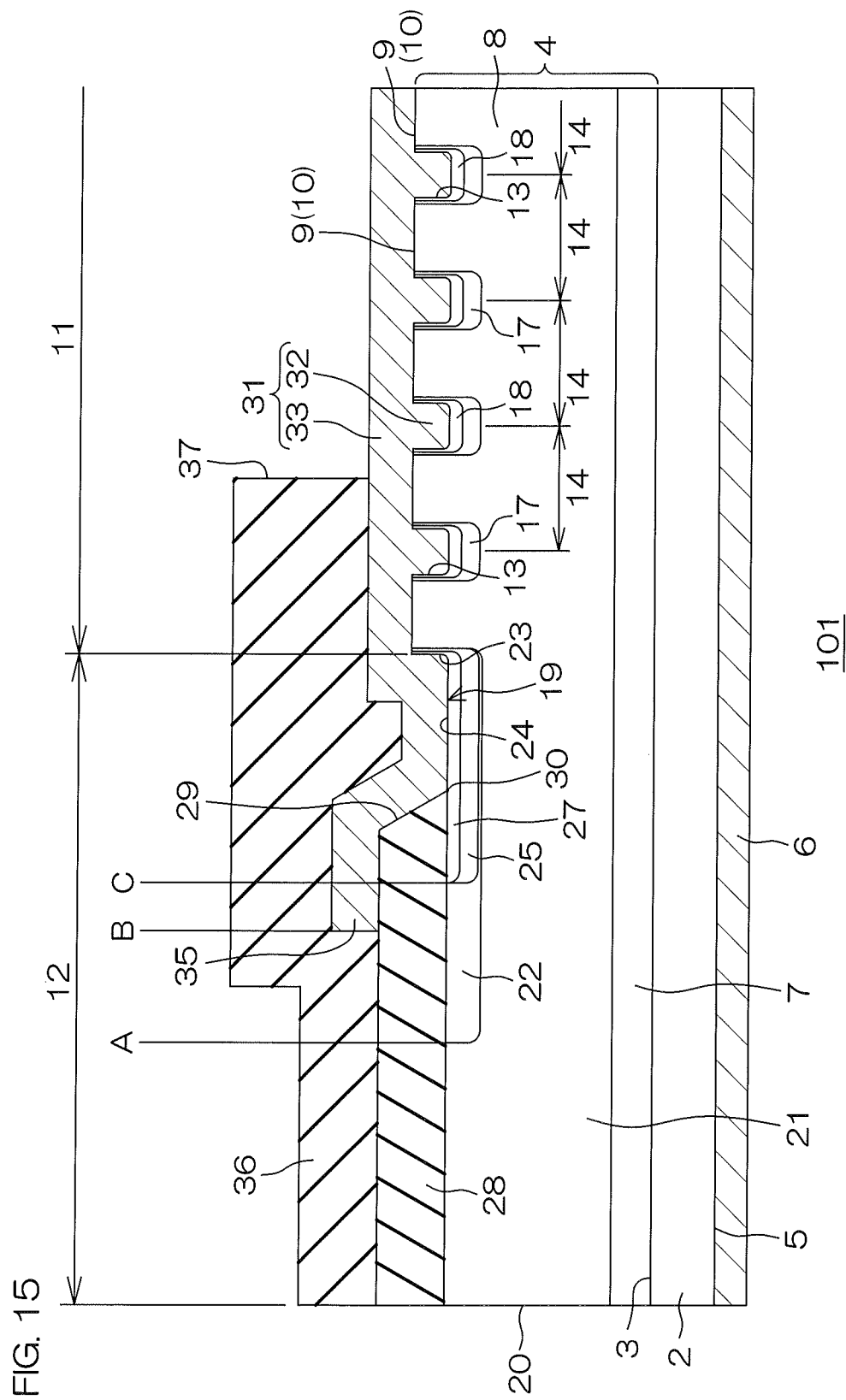
FIG. 15 is a schematic cross-sectional view of a semiconductor device according to a seventh preferred embodiment of the present invention.

FIG. 15 is a schematic cross-sectional view of a semiconductor device according to a seventh preferred embodiment of the present invention. In FIG. 15, the same reference sign as in FIG. 2 is given to a component corresponding to each component of FIG. 2 shown above.

Although the plurality of guard rings 26 were formed outside the p type JTE structure 22 in the first preferred embodiment of FIG. 2, the guard rings 26 are excluded in the semiconductor device 101 of this seventh preferred embodiment. This semiconductor device 101 also makes it possible to achieve the same effect as the semiconductor device 1 of the first preferred embodiment.

Figure 16:
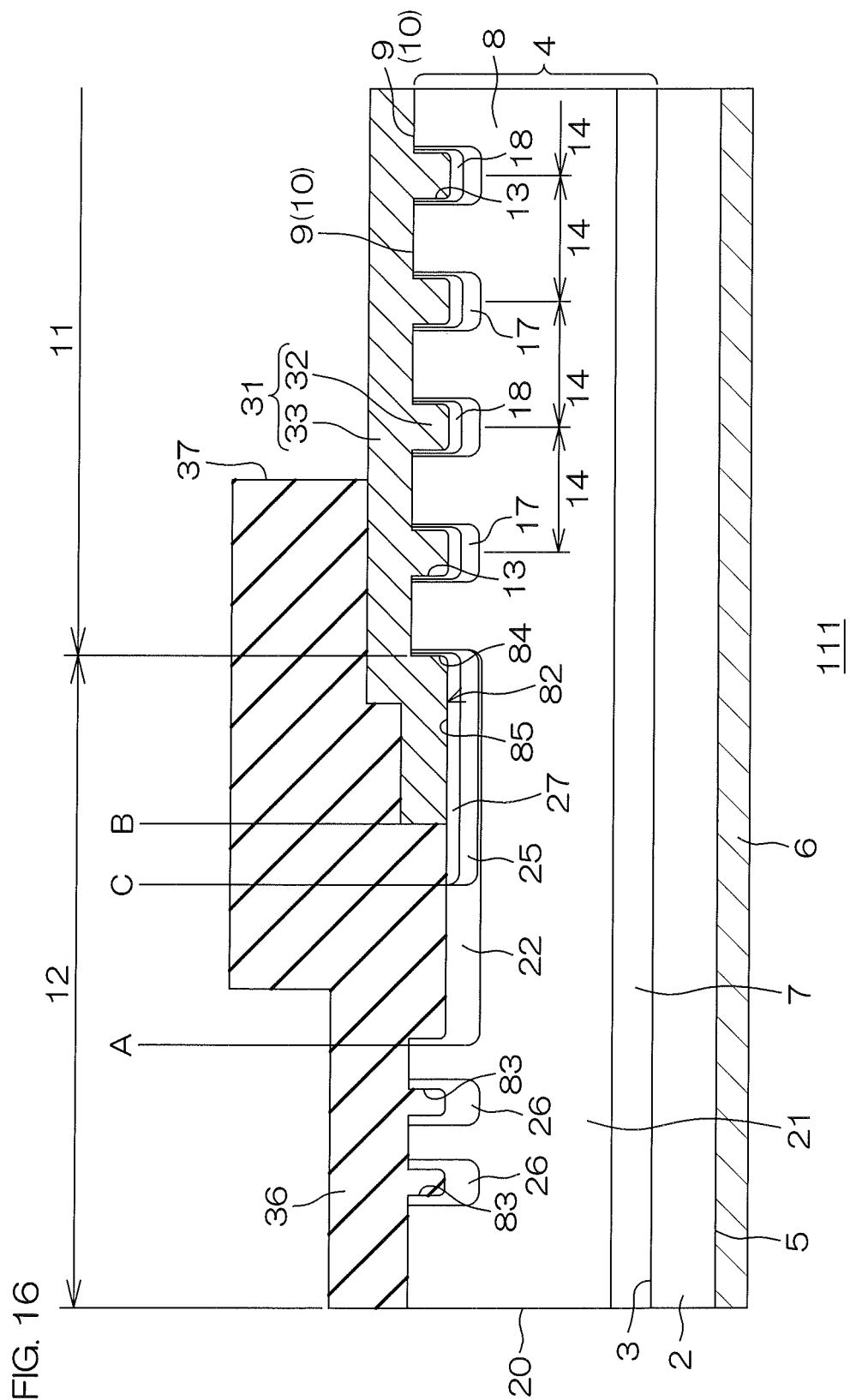
FIG. 16 is a schematic cross-sectional view of a semiconductor device according to an eighth preferred embodiment of the present invention.

FIG. 16 is a schematic cross-sectional view of a semiconductor device according to an eighth preferred embodiment of the present invention. In FIG. 16, the same reference sign as in FIG. 2 and in FIG. 13 is given to a component corresponding to each component of FIG. 2 and FIG. 13 shown above.

Although the field insulating film 28 was provided so as to be embedded in the guard ring trench 83 in the fifth preferred embodiment of FIG. 13, the field insulating film 28 is excluded in the semiconductor device 111 of this eighth preferred embodiment. The planar portion 33 of the anode electrode 31 is formed so as to be in contact with the side surface 84 and the bottom surface 85 of the JTE trenches 82. The electrode edge B of the planar portion 33 is positioned on the side closer to the active region 11 with respect to the p type layer edge C of the p type layer 25. The surface protection film 36 is formed so as to be in contact with the bottom surface 85 of the JTE trench 82 exposed from the anode electrode 31. The surface protection film 36 is embedded in the guard ring trench 83.

Figure 17:
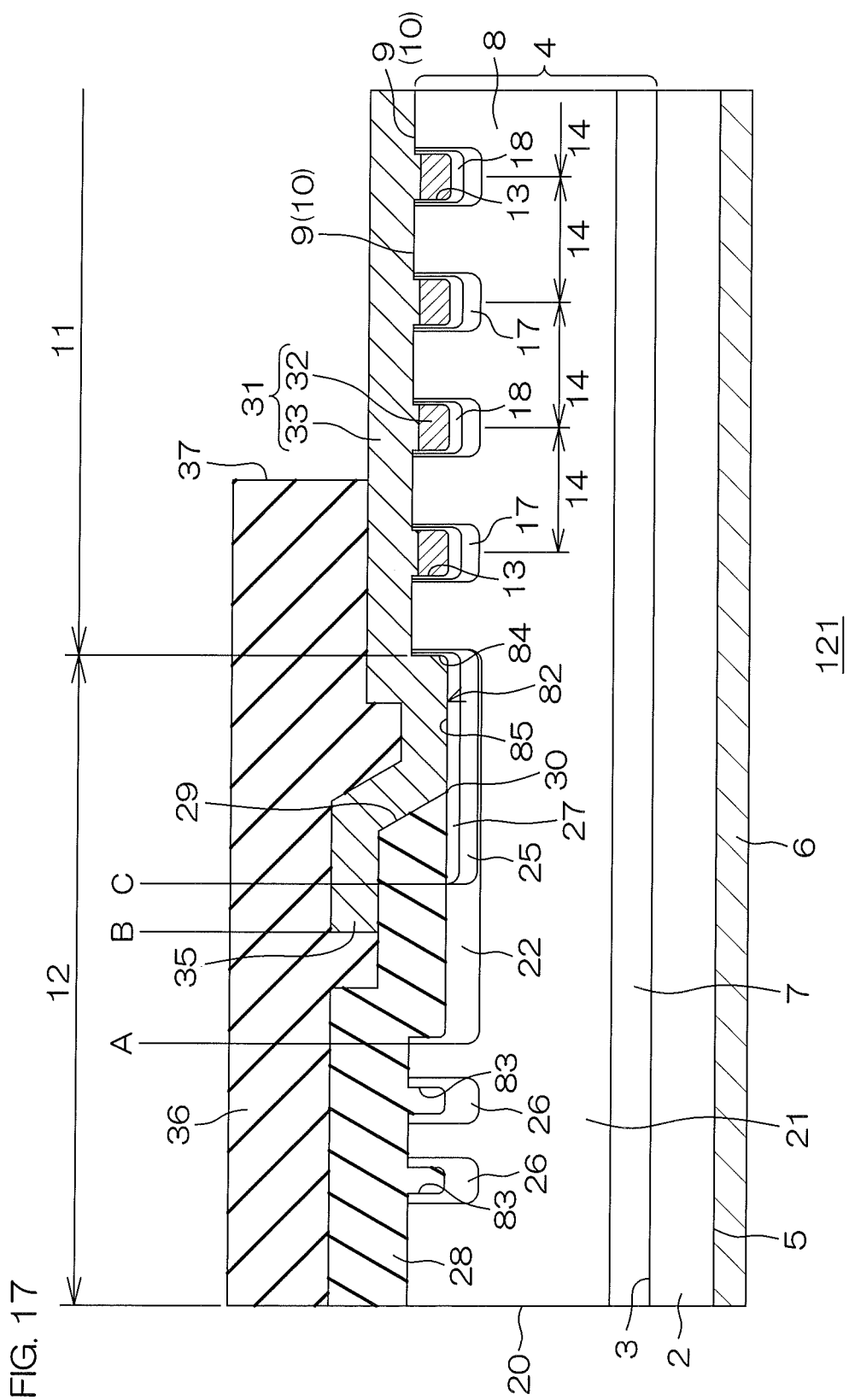
FIG. 17 is a schematic cross-sectional view of a semiconductor device according to a ninth preferred embodiment of the present invention.

FIG. 17 is a schematic cross-sectional view of a semiconductor device according to a ninth preferred embodiment of the present invention. In FIG. 17, the same reference sign as in FIG. 2 and in FIG. 13 is given to a component corresponding to each component of FIG. 2 and FIG. 13 shown above.

In the fifth preferred embodiment of FIG. 13, the planar portion 33 of the anode electrode 31 and the embedded portion 32 were integrally formed with the same material. On the other hand, in the semiconductor device 121 of this ninth preferred embodiment, the planar portion 33 and the embedded portion 32 are formed with mutually different materials.

As described above, Ti/Al and so forth can be used as the material of the planar portion 33. On the other hand, a material excellent in embedding properties, such as polysilicon (n type or p type doped polysilicon), tungsten (W), titanium (Ti), or an alloy of these elements, can be used as the material of the embedded portion 32.

Figure 18:
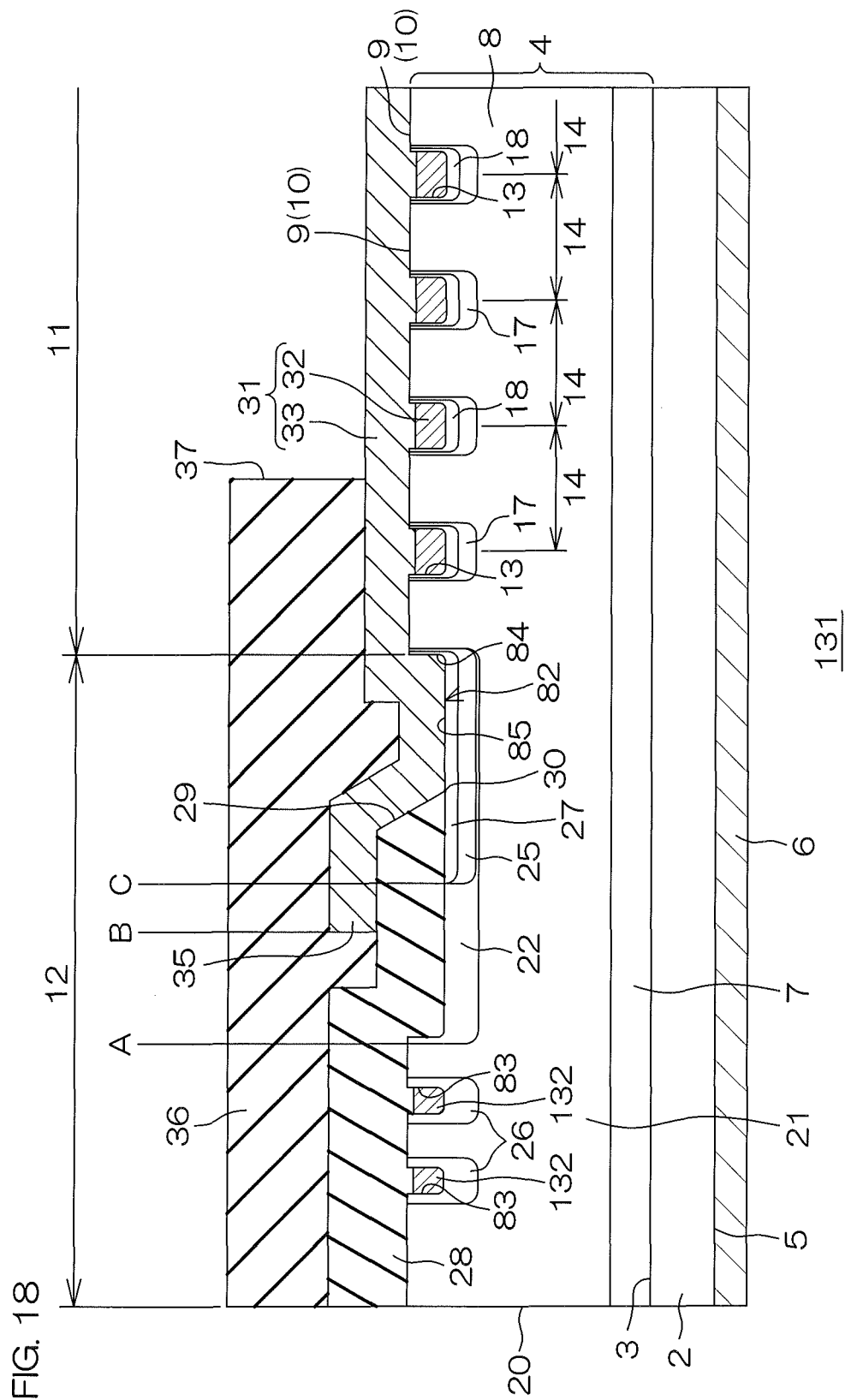
FIG. 18 is a schematic cross-sectional view of a semiconductor device according to a tenth preferred embodiment of the present invention.

FIG. 18 is a schematic cross-sectional view of a semiconductor device according to a tenth preferred embodiment of the present invention. In FIG. 18, the same reference sign as in FIG. 2 and in FIG. 17 is given to a component corresponding to each component of FIG. 2 and FIG. 17 shown above.

In the ninth preferred embodiment of FIG. 17, the field insulating film 28 was embedded in the guard ring trench 83. On the other hand, the semiconductor device 131 of this tenth preferred embodiment additionally includes a guard-ring embedding layer 132 embedded in the guard ring trench 83.

The same material as the embedded portion 32 of the anode electrode 31 can be used as the material of the guard-ring embedding layer 132. This makes it possible to simultaneously form the guard-ring embedding layer 132 and the embedded portion 32 of the anode electrode 31.

Figure 19:
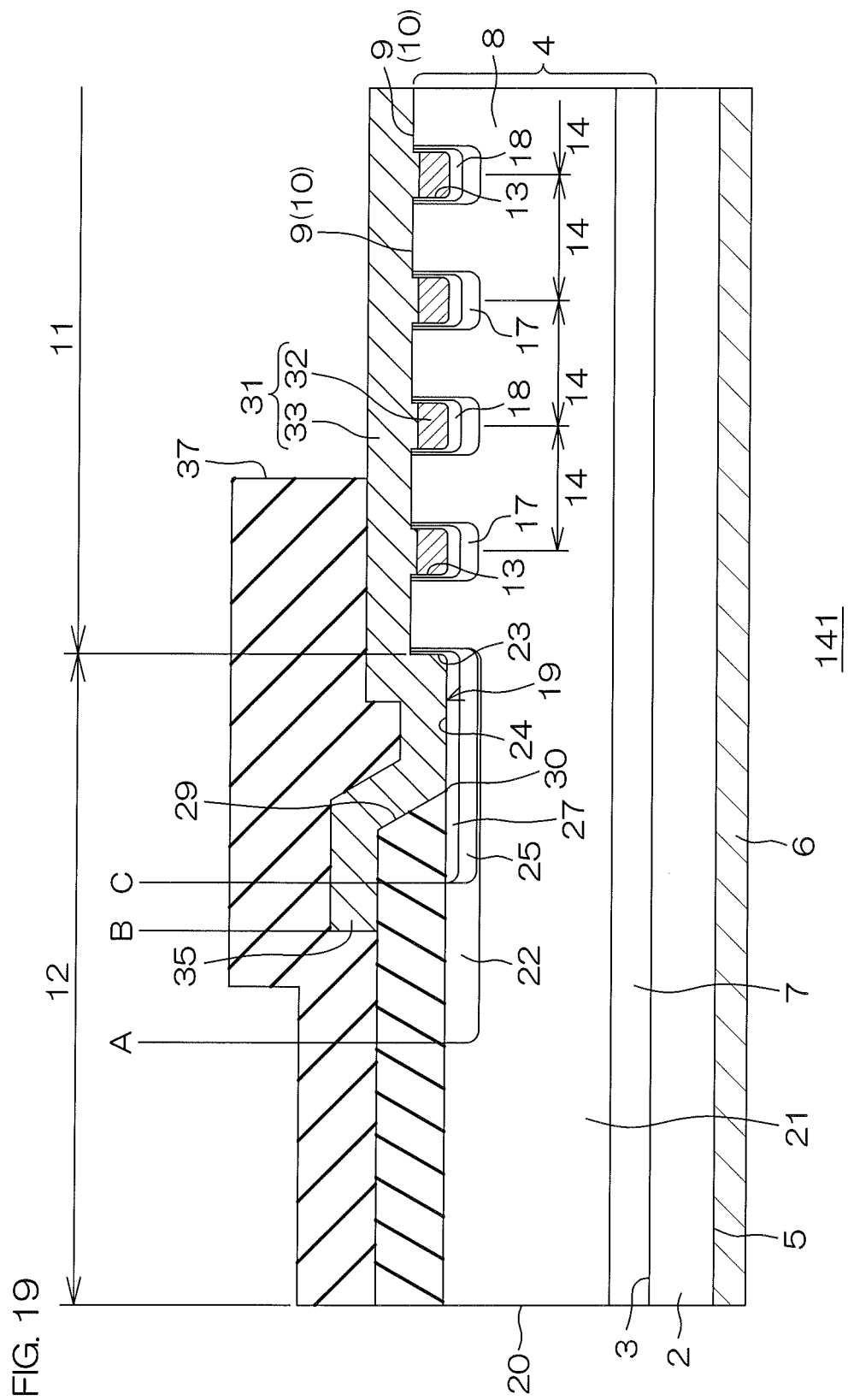
FIG. 19 is a schematic cross-sectional view of a semiconductor device according to an eleventh preferred embodiment of the present invention.

FIG. 19 is a schematic cross-sectional view of a semiconductor device according to an eleventh preferred embodiment of the present invention. In FIG. 19, the same reference sign as in FIG. 2 is given to a component corresponding to each component of FIG. 2 shown above.

In the first preferred embodiment of FIG. 2, the planar portion 33 of the anode electrode 31 and the embedded portion 32 were integrally formed with the same material. On the other hand, in the semiconductor device 141 of this eleventh preferred embodiment, the planar portion 33 and the embedded portion 32 are formed with mutually different materials.

As described above, Ti/Al and so forth can be used as the material of the planar portion 33. On the other hand, a material excellent in embedding properties, such as polysilicon (n type or p type doped polysilicon), tungsten (W), titanium (Ti), or an alloy of these elements, can be used as the material of the embedded portion 32.

Next, a method for forming the p type layers 17, 18, 22, and 25 to 27 of the semiconductor devices will be described while making a division into the case of the semiconductor devices 81, 91, 111, 121, and 131 each of which has the JTE trench 82 and the guard ring trench 83 and the case of the semiconductor devices 1, 51, 61, 71, and 141 each of which has the removal region 19.

First, the former, i.e., the case of the semiconductor devices 81, 91, 111, 121, and 131 will be described with reference to FIG. 20A and FIG. 20B.

Figure 20A:
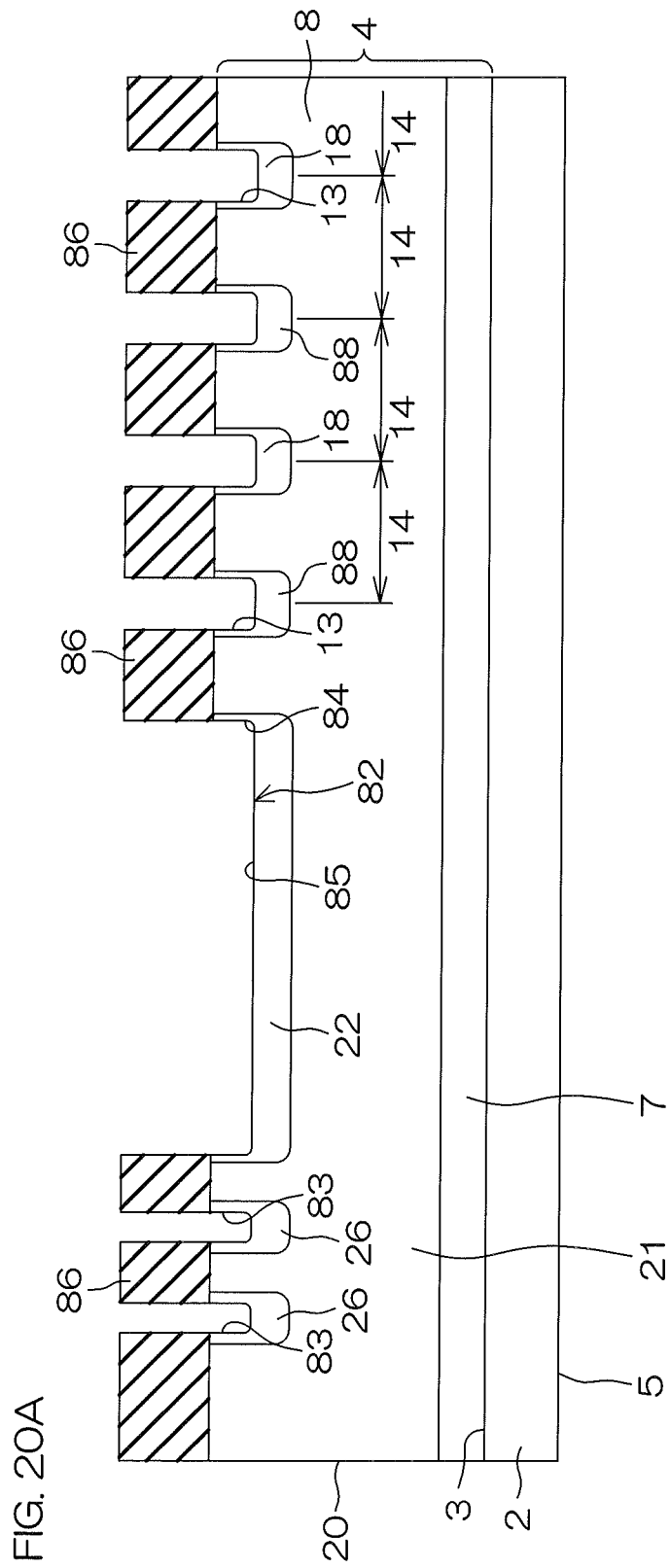
FIG. 20A is a view to describe a method for forming a p type layer.

As shown in FIG. 20A, a hardmask 86 that has openings according to the patterns of the trench 13, of the JTE trench 82, and of the guard ring trench 83 is formed, and the trench 13, the JTE trench 82, and the guard ring trench 83 are formed by an etching operation that uses the hard mask 86, and, simultaneously, unit cells 14 defined by the trench 13 are formed.

Thereafter, in a state in which the hard mask 86 remains, impurities (in the present preferred embodiment, Al ions) are selectively implanted into the inner surfaces of the trench 13, of the JTE trench 82, and of the guard ring trench 83. As a result, the p type JTE structure 22, the guard ring 26, and the p type layer 88 having the same shape as the p type layer 17 are simultaneously formed.

Figure 20B:
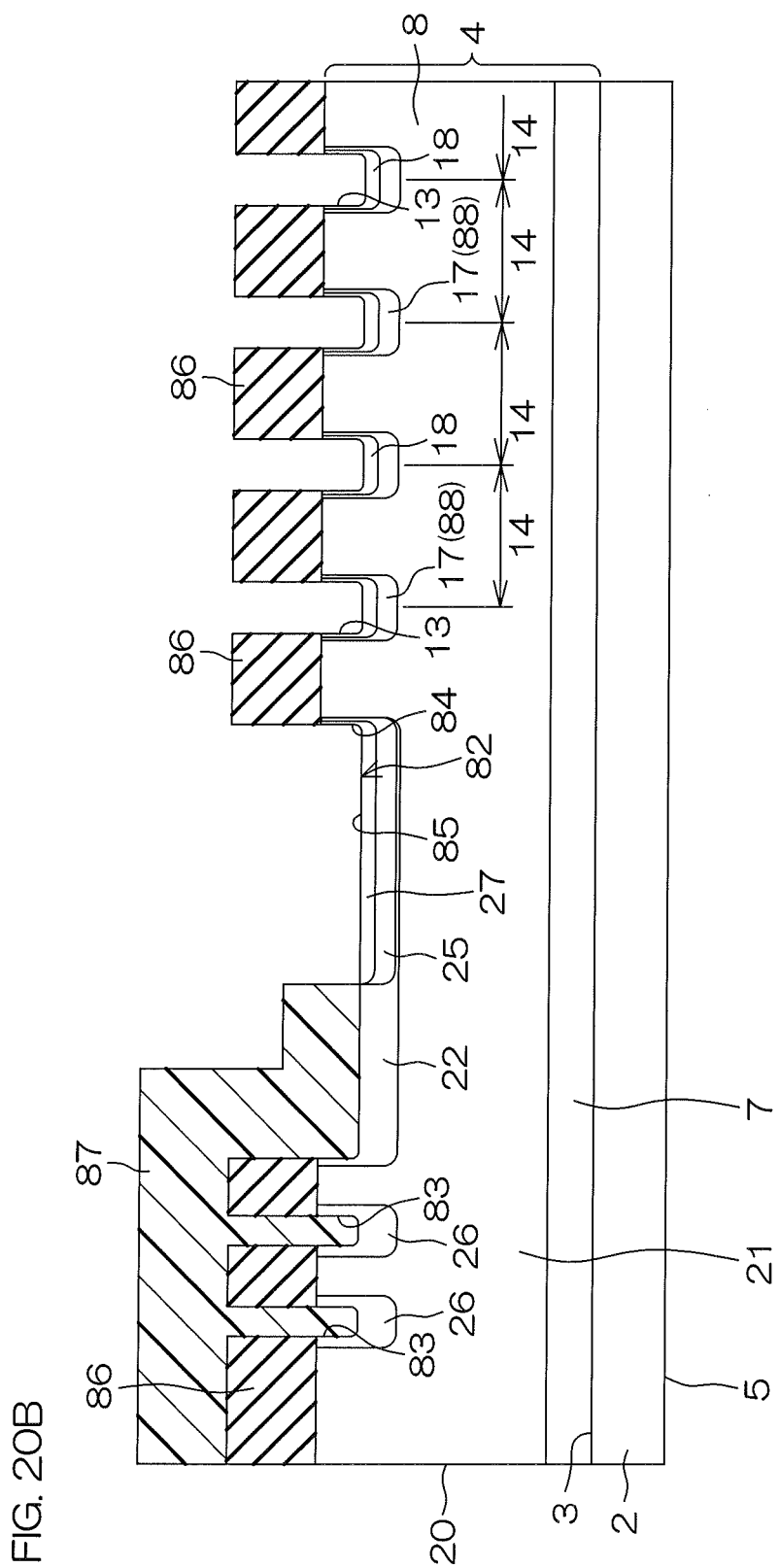
FIG. 20B is a cross-sectional view showing a step subsequent to that of FIG. 20A.

Thereafter, as shown in FIG. 20B, a resist mask 87 with which the p type JTE structure 22 and the guard ring 26 are selectively covered is formed. Thereafter, in a state in which this resist mask 87 and the hard mask 86 remain, impurities (in the present preferred embodiment, Al ions) are selectively implanted into the inner surfaces of the trench 13 and of the JTE trench 82. As a result, the p type layers 17, 25 and the $p^+$ type contact layers 18, 27, which are relatively higher in concentration than the p type JTE structure 22 and the guard ring 26, are simultaneously formed.

Figure 21A:
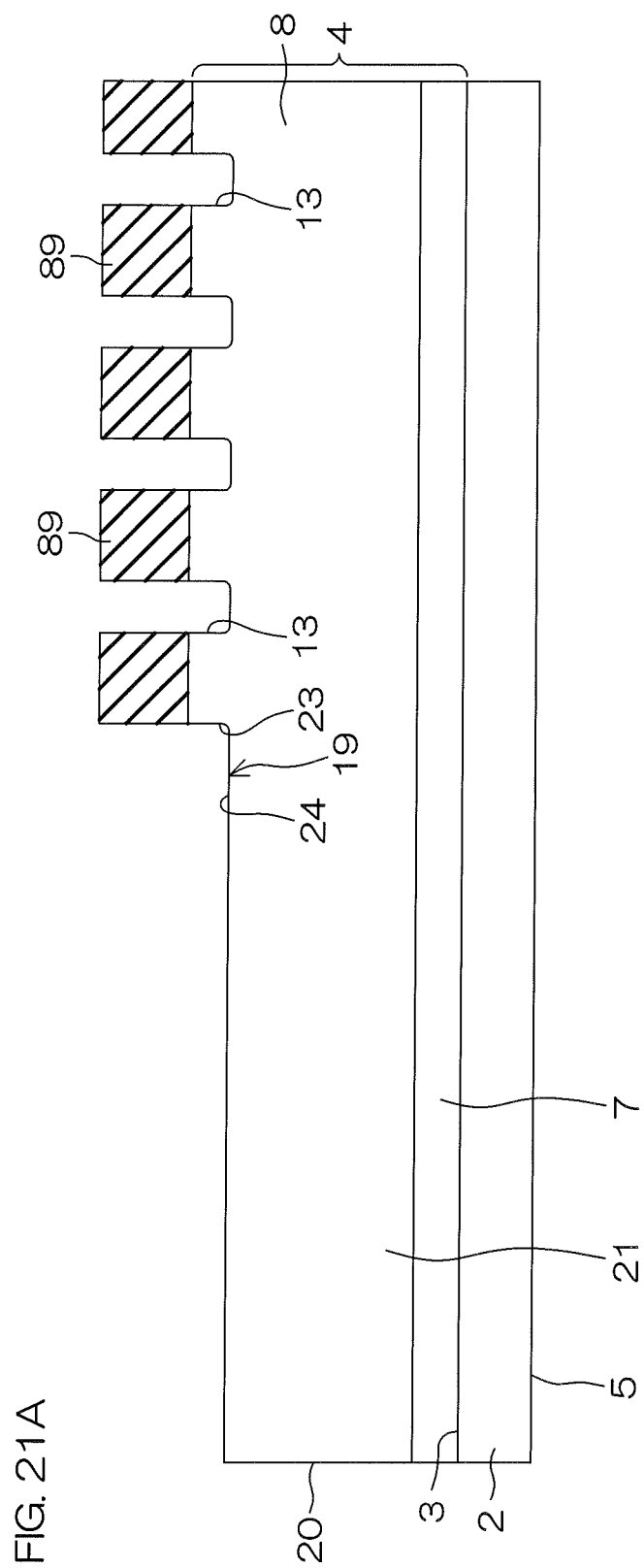
FIG. 21A is a view to describe a method for forming a p type layer.

Next, the latter, i.e., the case of the semiconductor devices 1, 51, 61, 71, and 141 will be described with reference to FIG. 21A to FIG. 21C.

As shown in FIG. 20A, a hardmask 89 that has openings according to the patterns of the trench 13 and of the removal region 19 is formed, and the trench 13 and the removal region 19 are formed by an etching operation that uses this hard mask 89, and, simultaneously, unit cells 14 defined by the trench 13 are formed.

Figure 21B:
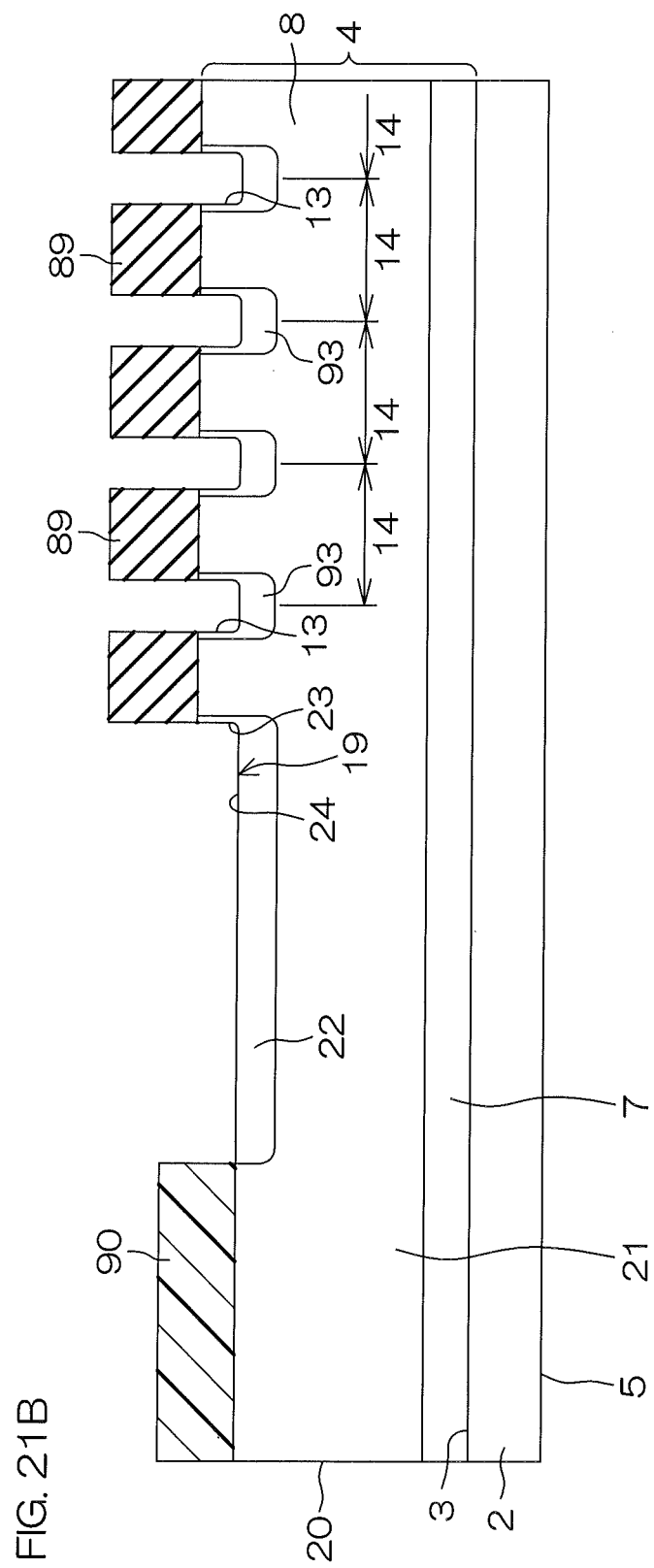
FIG. 21B is a cross-sectional view showing a step subsequent to that of FIG. 21A.

Thereafter, as shown in FIG. 21B, in a state in which the hard mask 89 remains, a resist mask 90 that has an opening according to the pattern of the p type JTE structure 22 in the removal region 19 is formed. Thereafter, impurities (in the present preferred embodiment, Al ions) are selectively implanted into the inner surfaces of the trench 13 and of the removal region 19 by use of the hard mask 89 and the resist mask 90. As a result, the p type JTE structure 22 and the p type layer 93 having the same shape as the p type layer 17 are simultaneously formed.

Figure 21C:
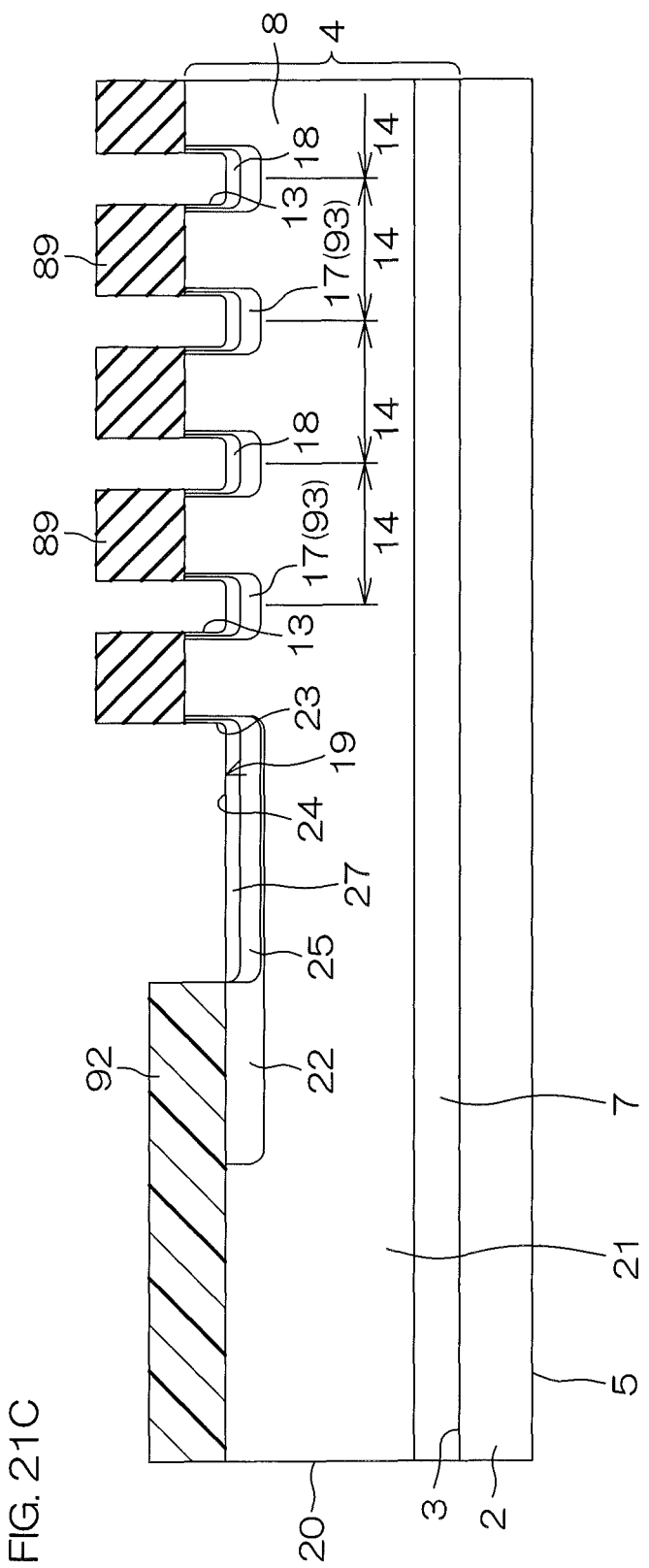
FIG. 21C is a cross-sectional view showing a step subsequent to that of FIG. 21B.

Thereafter, as shown in FIG. 21C, a resist mask 92 with which the p type JTE structure 22 is selectively covered is formed. Thereafter, in a state in which this resist mask 92 and the hard mask 89 remain, impurities (in the present preferred embodiment, Al ions) are selectively implanted into the inner surfaces of the trench 13 and of the JTE trench 82. As a result, the p type layers 17, 25 and the $p^+$ type contact layers 18, 27, which are relatively higher in concentration than the p type JTE structure 22, are simultaneously formed.

Although the preferred embodiments of the present invention have been described as above, the present invention can be embodied in other modes.

For example, it is possible to combine the aforementioned features comprehended from the disclosure of each of the aforementioned preferred embodiments together among different preferred embodiments.

Additionally, an arrangement formed by reversing the conductivity type in each semiconductor part of the semiconductor devices 1, 51, 61, 71, 81, 91, 101, 111, 121, 131, and 141 may be employed. For example, in the semiconductor device 1, the p type part may be an n type, and the n type part may be a p type.

The semiconductor device (semiconductor power device) of the present invention is capable of being incorporated into a power module for use in an inverter circuit forming a driving circuit to drive an electric motor that is used as a power source of, for example, an electric automobile (including a hybrid automobile), a train, and an industrial robot. Additionally, the semiconductor device of the present invention is also capable of being incorporated into a power module for use in an inverter circuit that converts electric power generated by a solar battery, by a wind generator, or by other power generators (particularly, a private electric generator) so as to match the electric power of a commercial power source.

Besides, various design changes can be made within the scope of the matters recited in the appended claims.

The preferred embodiments of the present invention are merely concrete examples used to clarify the technical contents of the present invention, and the present invention should not be understood by being limited to these concrete examples, and the spirit and scope of the present invention are limited solely by the appended claims.

The present application corresponds to Japanese Patent Application No. 2012-269771 filed in the Japan Patent Office on Dec. 10, 2012, and the entire disclosure of this application is incorporated herein by reference.

REFERENCE SIGNS LIST

1 Semiconductor device
2 n$^+$ type substrate
4 Epitaxial layer
6 Cathode electrode
7 n type buffer layer
8 n$^-$ type drift layer
9 (Unit cell) Upper surface
10 (Epitaxial layer) Surface
11 Active region
12 Outer peripheral region
13 Trench
14 Unit cell
15 (Trench) Bottom surface
16 (Trench) Side surface
17 p type layer
18 p$^+$ type contact layer
19 Removal region
20 (Epitaxial layer) End surface
22 p type JTE structure
23 (Removal region) Side surface
24 (Removal region) Bottom surface
25 p type layer
26 Guard ring
27 p$^+$ type contact layer
28 Field insulating film
29 Contact hole
31 Anode electrode
38$a_1$ Side surface
38$a_2$ Side surface
38$a_3$ Side surface
39$a_1$ Side surface
39$a_2$ Side surface
40$a_1$ Side surface
40$a_2$ Side surface
40$a_3$ Side surface
41$a_1$ Side surface
42$a_2$ Side surface
42$a_3$ Side surface
43 Sacrificial oxide film
51 Semiconductor device
61 Semiconductor device
71 Semiconductor device
81 Semiconductor device
82 JTE trench
83 Guard ring trench
84 (Trench) Side surface
85 (Trench) Bottom surface
91 Semiconductor device
101 Semiconductor device
111 Semiconductor device
121 Semiconductor device
131 Semiconductor device
141 Semiconductor device
A JTE edge
B Electrode edge
C p type layer edge

The invention claimed is:

1. A semiconductor device comprising:
a semiconductor layer made of a wide bandgap semiconductor;
a trench that is selectively formed on a surface portion of the semiconductor layer and that defines a unit cell having a predetermined shape on the surface portion; and
a surface electrode that is embedded in the trench so as to cover an upper surface of the unit cell and that forms a Schottky junction between the unit cell and the surface electrode;
side surfaces of the trench being formed of only a plurality of planes that have plane orientations crystallographically equivalent to each other, wherein
the surface of the semiconductor layer having an active region in which the unit cell is disposed and an outer peripheral region that surrounds the active region, and
the semiconductor device further includes:
a removal region formed at the surface portion of the semiconductor layer in the outer peripheral region,
a first conductivity type terminal structure formed so as to follow a bottom surface of the removal region, and
a plurality of guard rings formed on an outer side, the outer side being toward an end surface of the semiconductor layer with respect to the terminal structure.

2. The semiconductor device according to claim 1, wherein the side surfaces of the trench are formed of only a plurality of planes that move to each other as a result of a symmetry operation in which a rotation of a predetermined angle is made around a predetermined crystallographic axis.

3. The semiconductor device according to claim 1, wherein the unit cell is formed in a linear shape, or a rhombic shape, or a hexagonal shape when viewed planarly.

4. The semiconductor device according to claim 1, wherein the semiconductor layer includes a first conductivity type electric field relaxation layer formed so as to follow a part of or all of inner surfaces of the trench and a second conductivity type drift layer formed contiguously with the electric field relaxation layer so as to be exposed to the upper surface of the unit cell, and wherein the surface electrode forms a Schottky junction between the drift layer and the surface electrode.

5. The semiconductor device according to claim 1, wherein the semiconductor device further includes a first conductivity type layer that is formed in the terminal structure and that is relatively higher in concentration than the terminal structure, and wherein the first conductivity type layer is disposed in a position inwardly away from an outer periphery of the terminal structure.

6. The semiconductor device according to claim 1, wherein the semiconductor device includes a field insulating film formed at the bottom surface of the removal region so as to selectively cover the terminal structure.

7. The semiconductor device according to claim 1, wherein the terminal structure has an impurity concentration different from an impurity concentration of the electric field relaxation layer, and is formed in a depth position that is the same as the electric field relaxation layer or in a position that is deeper than the electric field relaxation layer.

8. The semiconductor device according to claim 2, wherein the semiconductor layer is made of 4H—SiC, and the side surfaces of the trench are formed of only a plurality of planes that move to each other as a symmetry operation in which a rotation of 60 degrees is made around a [0001] axis.

9. The semiconductor device according to claim 4, wherein the electric field relaxation layer includes a highly-concentrated layer that is selectively formed at an exposed part of the inner surfaces of the trench and that is higher in concentration than other parts of the electric field relaxation layer.

10. The semiconductor device according to claim 5, wherein the first conductivity type layer includes a highly-concentrated region that is formed so as to be exposed from the bottom surface of the removal region and that is higher in concentration than the first conductivity type layer.

11. The semiconductor device according to claim 5, wherein an edge of the terminal structure, an edge of the surface electrode, and an edge of the first conductivity type layer are disposed in this order from the end surface of the semiconductor layer.

12. The semiconductor device according to claim 5, wherein the surface electrode forms an ohmic contact between the first conductivity type layer and the surface electrode.

13. The semiconductor device according to claim 6, wherein a contact hole that selectively exposes an all area of the active region and a part of the outer peripheral region is formed in the field insulating film, and the contact hole is formed in a tapered shape whose width becomes greater toward an opening end.

14. The semiconductor device according to claim 6, wherein the field insulating film is made of $SiO_2$ (silicon oxide) or SiN (silicon nitride).

15. The semiconductor device according to claim 6, wherein the surface electrode is formed so as to ride on the field insulating film so that the edge of the surface electrode is positioned on the field insulating film.

16. The semiconductor device according to claim 9, wherein the surface electrode forms an ohmic contact between the highly-concentrated layer and the surface electrode.

17. The semiconductor device according to claim 9, wherein the highly-concentrated layer is formed in an area that is shallower than a depth position of 1000 Å from the inner surfaces of the trench.

18. The semiconductor device according to claim 10, wherein the highly-concentrated region is formed in an area that is shallower than a depth position of 1000 Å from the bottom surface of the removal region.

19. A method for manufacturing a semiconductor device, the method comprising:

a step of forming a trench by etching a semiconductor layer made of a wide bandgap semiconductor so that side surfaces of the trench are formed of only a plurality of planes, which have plane orientations crystallographically equivalent to each other, and, simultaneously, the trench defining a unit cell having a predetermined shape;

a step of forming a sacrificial oxide film on the side surfaces of the trench by means of thermal oxidation;

a step of peeling off the sacrificial oxide film; and a step of embedding a surface electrode in the trench so as to cover the upper surface of the unit cell after peeling off the sacrificial oxide film, the surface electrode being made of a material that forms a Schottky junction between the unit cell and the surface electrode.

20. The method for manufacturing a semiconductor device according to claim 19, wherein the step of embedding the surface electrode in the trench includes a step of embedding polysilicon, tungsten (W), titanium (Ti), or an alloy of these elements according to a CVD method.

21. A semiconductor device comprising:

a semiconductor layer made of a wide bandgap semiconductor that has a surface partitioned into an active region and an outer peripheral region that surrounds the active region;

a trench selectively formed on a surface portion of the semiconductor layer in the active region;

a first conductivity type electric field relaxation layer formed so as to follow a part of or all of inner surfaces of the trench;

a second conductivity type drift layer formed contiguously with the electric field relaxation layer so as to be exposed to the surface portion of the semiconductor layer;

a surface electrode that is embedded in the trench so as to cover the surface portion of the semiconductor layer and that forms a Schottky junction between the drift layer and the surface electrode;

a removal region formed at the surface portion of the semiconductor layer in the outer peripheral region; and a first conductivity type terminal structure formed so as to follow a bottom surface of the removal region;

wherein the terminal structure has an impurity concentration different from an impurity concentration of the electric field relaxation layer, and is formed in a depth position that is the same as the electric field relaxation layer or in a position that is deeper than the electric field relaxation layer, and the semiconductor device further includes a plurality of guard rings formed on an outer side, the outer side being toward an end surface of the semiconductor layer with respect to the terminal structure.

22. The semiconductor device according to claim 21, wherein the semiconductor device further includes a first conductivity type layer that is formed in the terminal structure and that is relatively higher in concentration than the terminal structure, and wherein the first conductivity type layer is disposed in a position inwardly away from an outer periphery of the terminal structure.

23. The semiconductor device according to claim 21, wherein the semiconductor device includes a field insulating film formed at the bottom surface of the removal region so as to selectively cover the terminal structure.

24. The semiconductor device according to claim 22, wherein the first conductivity type layer includes a highly-concentrated region that is formed so as to be exposed from the bottom surface of the removal region and that is higher in concentration than the first conductivity type layer.

25. The semiconductor device according to claim 22, wherein an edge of the terminal structure, an edge of the surface electrode, and an edge of the first conductivity type layer are disposed in this order from the end surface of the semiconductor layer.

26. The semiconductor device according to claim 22, wherein the surface electrode forms an ohmic contact between the first conductivity type layer and the surface electrode.

27. The semiconductor device according to claim 23, wherein the surface electrode is formed so as to ride on the field insulating film so that the edge of the surface electrode is positioned on the field insulating film.

* * * * *